(12) United States Patent
Chu et al.

(10) Patent No.: US 12,745,616 B2
(45) Date of Patent: Sep. 22, 2026

(54) SEMICONDUCTOR STRUCTURE INCLUDING LINES OF DIFFERENT HEIGHT

(71) Applicant: TAIWAN SEMICONDUCTOR MANUFACTURING COMPANY, LTD., Hsinchu (TW)

(72) Inventors: Wei-Chen Chu, Hsinchu (TW); Chia-Tien Wu, Hsinchu (TW); Chuan-Pu Chou, Hsinchu (TW); Hsin-Ping Chen, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 414 days.

(21) Appl. No.: 18/366,096

(22) Filed: Aug. 7, 2023

(65) Prior Publication Data

US 2025/0054811 A1 Feb. 13, 2025

(51) Int. Cl.

*H10W 20/00* (2026.01)
*H10P 76/40* (2026.01)
*H10W 20/41* (2026.01)
*H10W 20/42* (2026.01)
*H10W 20/46* (2026.01)

(52) U.S. Cl.

CPC ......... *H10W 20/063* (2026.01); *H10P 76/408* (2026.01); *H10W 20/067* (2026.01); *H10W 20/072* (2026.01); *H10W 20/098* (2026.01); *H10W 20/42* (2026.01); *H10W 20/435* (2026.01); *H10W 20/46* (2026.01)

(58) Field of Classification Search

CPC ......... H01L 21/76892; H01L 21/76885; H01L 21/0334; H10W 20/063; H10P 76/408

See application file for complete search history.

(56) References Cited

U.S. PATENT DOCUMENTS 10,991,618 B2 * 4/2021 Yang ................. H01L 21/31144
11,171,044 B1 * 11/2021 Xie ................... H01L 21/76802
11,361,994 B2 * 6/2022 Chen ................. H01L 21/76897

* cited by examiner

*Primary Examiner* — Daniel Luke
(74) *Attorney, Agent, or Firm* — Birch, Stewart, Kolasch & Birch, LLP

(57) ABSTRACT

A method for manufacturing a semiconductor structure includes: forming a patterned first layer which is made of a first electrically conductive material, and which includes first lines, second lines, and a connection portion disposed on a part of one of the first lines, the first lines having a height lower than a height of the second lines; forming a first via which is connected to an upper surface of the connection portion, the first via having a height above the connection portion; and forming a second via which is connected to an upper surface of one of the second lines, the second via having a height that is the same as the height of the first via above the connection portion.

20 Claims, 19 Drawing Sheets

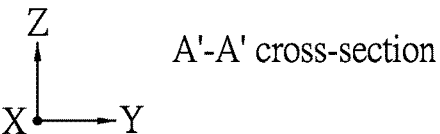
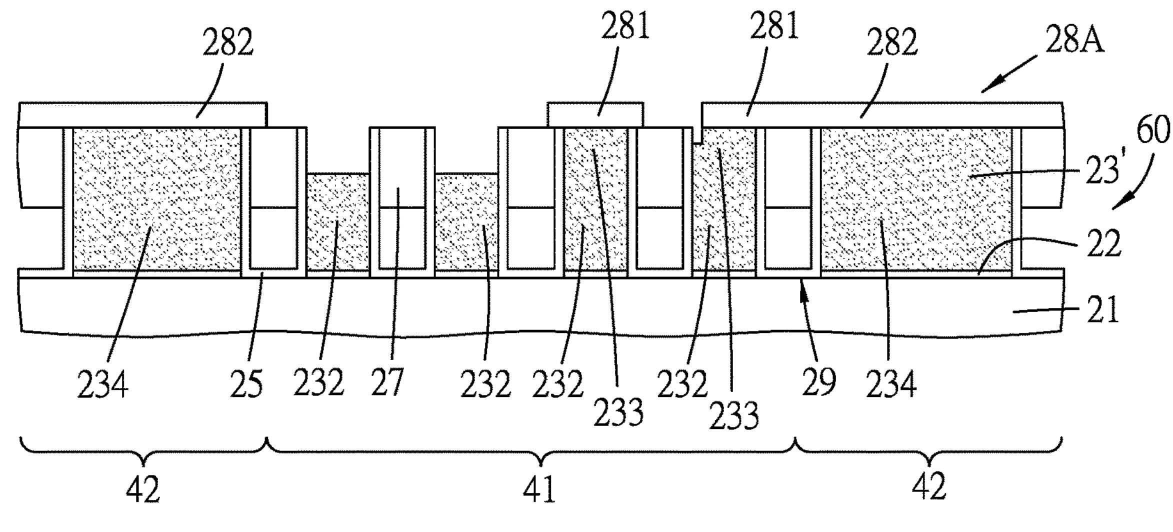
FIG. 30
Z
A'-A' cross-section
X Y
282 281 281 282
512A
511A
28A
23' 60
22
21
234 25 232 27 232 232 233 232 233 29 234
42 41 42
FIG. 31

SEMICONDUCTOR STRUCTURE INCLUDING LINES OF DIFFERENT HEIGHT

BACKGROUND

As scaling down of semiconductor device continues in the IC industry, there is an urgent need to enhance interconnect structures, so as to improve performance thereof. For instance, there is research focusing on RC delay of interconnect structures to achieve a reduction in resistance and/or capacitance of interconnect structures.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2 to 36 are schematic views illustrating intermediate stages of the method for manufacturing the semiconductor structure in accordance with some embodiments.

DETAILED DESCRIPTION

Figure 1:
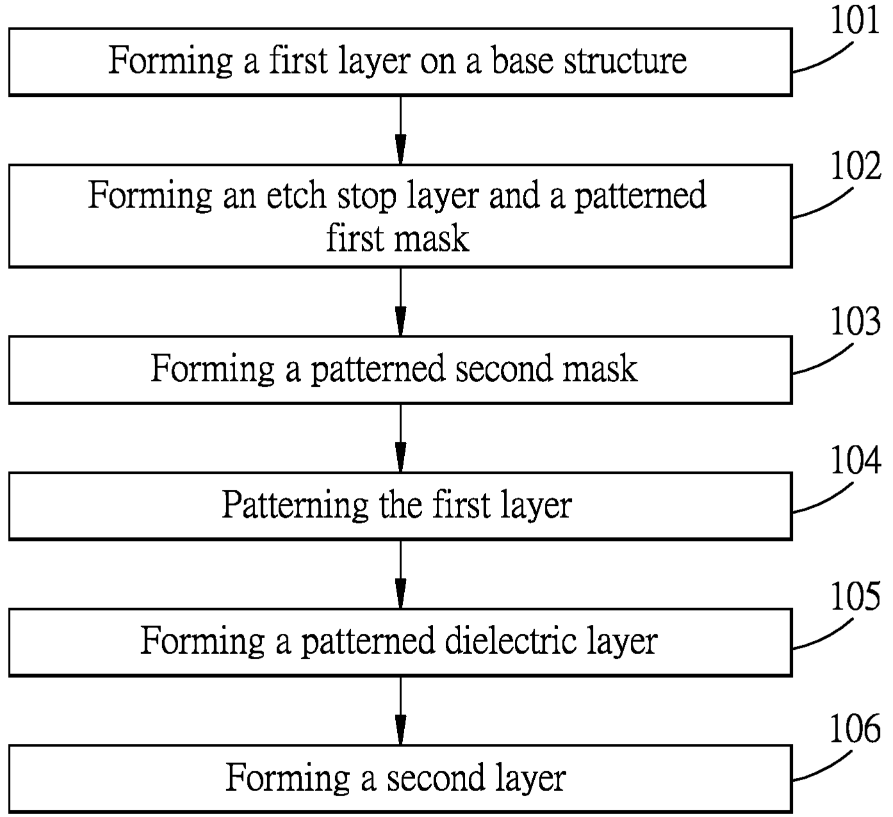
FIG. 1 is a flow diagram illustrating a method for manufacturing a semiconductor structure in accordance with some embodiments.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "on," "above," "top," "bottom," "bottommost," "upper," "uppermost." "lower," "lowermost," "over," "beneath," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

For the purposes of this specification and appended claims, unless otherwise indicated, all numbers expressing amounts, sizes, dimensions, proportions, shapes, formulations, parameters, percentages, quantities, characteristics, or other numerical values used in the specification and claims, are to be understood as being modified in all instances by the term "about" even if the term "about" is not explicitly recited with the values, amounts or ranges. Accordingly, unless indicated to the contrary, the numerical parameters set forth in the following specification and appended claims are not and need not be exact, but may be approximations and/or larger or smaller than specified as desired, may encompass tolerances, conversion factors, rounding off, measurement error, and other factors known to those of skill in the art depending on the desired properties sought to be obtained by the presently disclosed subject matter. For example, the term "about," when used with a value, can capture variations of, in some aspects±10%, in some aspects±5%, in some aspects±2.5%, in some aspects±1%, in some aspects±0.5%, and in some aspects±0.1% from the specified amount, as such variations are appropriate to perform the disclosed methods or employ the disclosed compositions.

By adopting different materials (e.g., metals and low-k materials) in interconnect structures, overall resistance and capacitance of the interconnect structures may be reduced, so that the interconnect structures are capable of fulfilling increasing demand with excellent performance. To achieve further enhancement, in some cases, low resistance, or low capacitance interconnect structures may be desired so as to satisfy different final product specifications. In view of this, new interconnect structures with lower capacitance and/or resistance are in urgent need.

Figure 24:
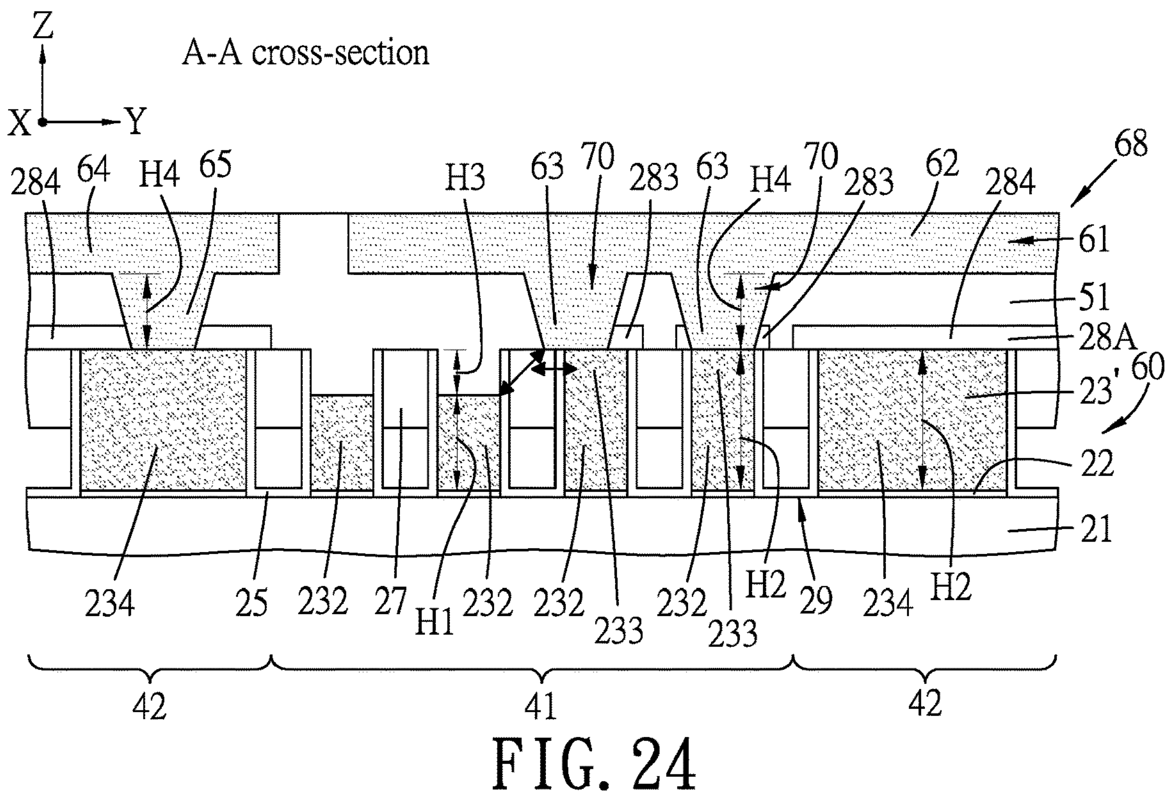

The present disclosure is directed to a semiconductor structure including lines formed with different heights, and a method for manufacturing the same. Referring to FIG. 24, the semiconductor structure includes a plurality of interconnect level structures, such as a first interconnect level structure 60 and a second interconnect level structure 68. The first interconnect level structure 60 includes a first region 41, a second region 42 and dielectric units 29. The first region 41 includes a plurality of first lines 232 having a first height (H1), and a connection portion 233 (may be referred to as a semi via) formed on a part of a predetermined one of the first lines 232. The second region 42 includes a plurality of second lines 234 that have a second height (H2) greater than the first height (H1). That is, at the first interconnect level structure 60, the first region 41, including the relatively shorter first lines 232, may be considered as a relatively low capacitance region; and the second region 42, including the relatively higher second lines 234, may be considered as a relatively low resistance region. The first and second lines 232, 234 are spaced apart from each other by the dielectric units 29. In some embodiments, the connection portion 233 is formed on the part of the predetermined one of the first lines 232 between two adjacent ones of the dielectric units 29 in a self-aligned manner since the connection portion 233 and the predetermined one of the first lines 232 are integrally formed by patterning lines 231 as illustrated in FIGS. 14 to 17. The second interconnect level structure 61 is formed on the first interconnect level structure 60, and includes a third line 62, and a first via 63 connected to an upper surface of the connection portion 233 of the first interconnect level structure 60, so as to permit the predetermined one of the first lines 232 to be connected to the third line 62 through the first via 63 and the connection portion 233. That is, the first via 63 and the connection portion 233 cooperatively form a via feature 70 that interconnects the third line 61 in the second interconnect level structure 61, and the predetermined one of the first lines 232 in the first interconnect level structure 60. In the case that the first and second lines 232, 234 have the same height (not shown in figures), if a via (not shown), which is formed on one of the first lines 232, is accidentally shifted toward an adjacent one of the dielectric units 29, a minimal distance between the via and the corresponding adjacent one of the first lines 232 will be reduced, which undesirably affects time-dependent dielectric breakdown (TDDB) in the one of the dielectric units 29. In this disclosure, the first lines 232 have a reduced height relative to the second lines 234, and the connection portion 233 is formed in the self-aligned manner to compensate the reduced height, resulting in a minimal distance between the via and an adjacent one of the dielectric units being comparatively greater, and thus, even if the first via 63 is accidentally shifted toward one of the dielectric units 29, time-dependent dielectric breakdown (TDDB) in the one of the dielectric units 29 is larger and more acceptable. In addition, although the first lines and second lines 232, 234 are formed with different heights, the connection portion 233 facilitates depth loading issue in formation of the first via 63 over the relatively lower first lines 232 and compensates for the height difference of first and second lines 232, 234. Moreover, the first region 41 with a relatively low capacitance is substantially free of high-k material (e.g., etch stop layer material) or has the high-k material with a relatively smaller occupied area, which favors further reduction in capacitance of the first interconnect level structure 60.

FIG. 1 is a flow diagram illustrating a method for manufacturing the semiconductor structure (for example, the semiconductor structure shown in FIG. 24) in accordance with some embodiments. FIGS. 2 to 26 illustrate schematic views of intermediate stages of the method in accordance with some embodiments. Some repeating structures are omitted in FIGS. 2 to 26 for the sake of brevity. Additional steps can be provided before, after or during the method, and some of the steps described herein may be replaced by other steps or be eliminated.

Figure 6:
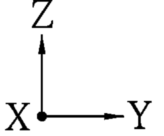
Figure 6:
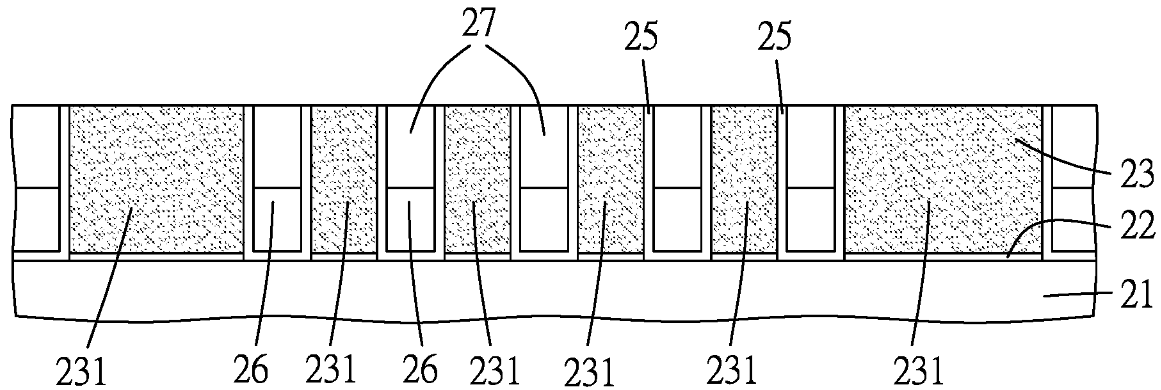
Figure 7:
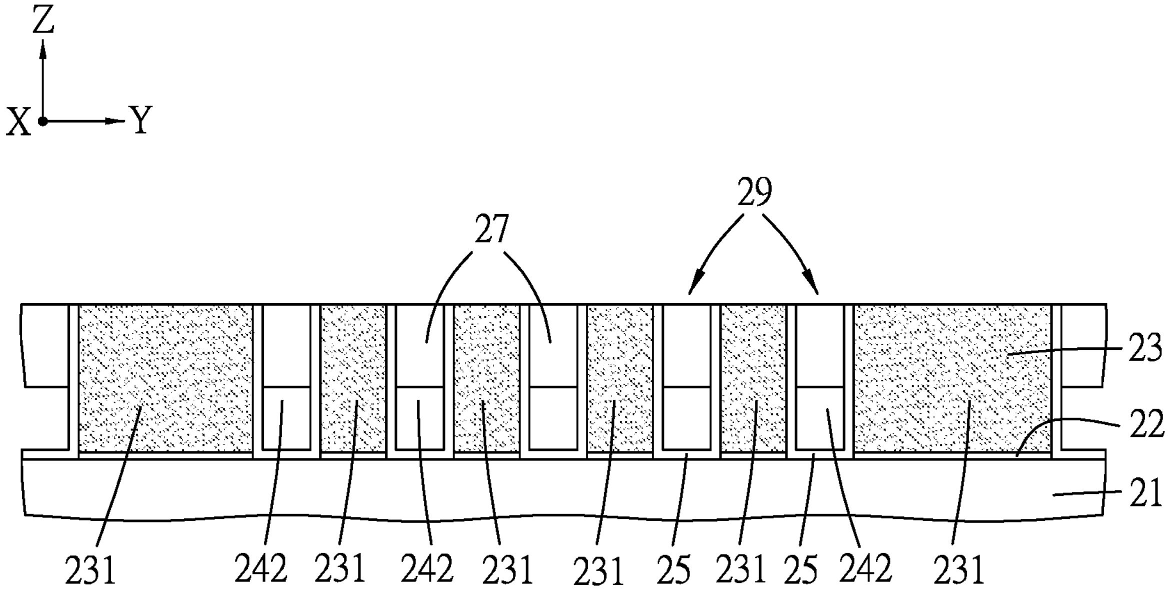

Referring to FIG. 1 and the example illustrated in FIG. 7, the method begins at step 101, where a first layer 23 and dielectric units 29 are formed on a base structure. Step 101 may include sub-steps illustrated in FIGS. 2 to 7 in accordance with some embodiments.

Figure 2:
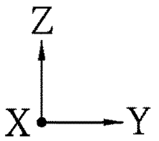
Figure 2:
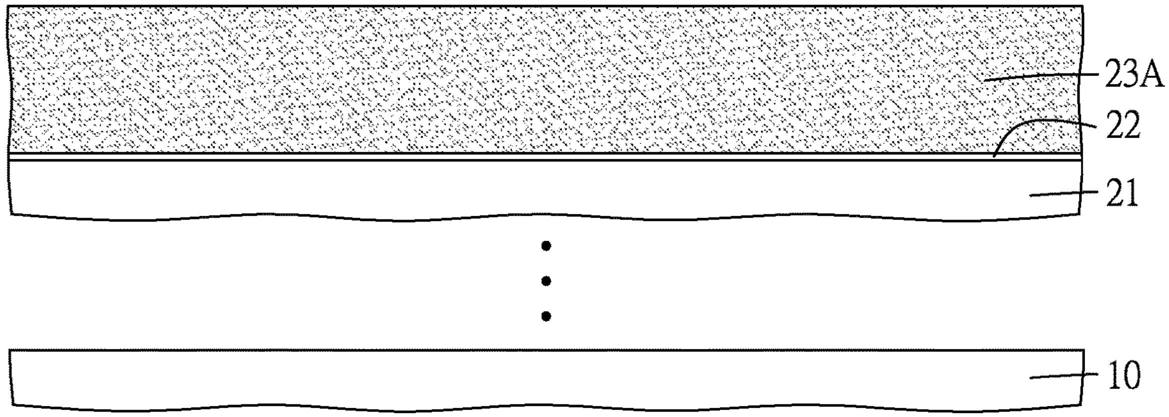

Referring to FIG. 2, a stack may include a substrate 10, a front-end-of-line (FEOL) part (not shown), an interlayer dielectric (ILD) layer 21, a glue layer 22, and a first interconnect material layer 23A that are sequentially formed on the substrate 10. The stack may further include any other suitable components based on practical requirements and final product specification. For example, one or more interconnect structures (not shown), which may be considered as a portion of a back-end-of-line (BEOL) part, may be formed between the FEOL part and the ILD layer 21.

The substrate 10 may be made of elemental semiconductor materials, such as crystalline silicon, diamond, or germanium; compound semiconductor materials, such as silicon carbide, gallium arsenide, indium arsenide, or indium phosphide; or alloy semiconductor materials, such as silicon germanium, silicon germanium carbide, gallium arsenide phosphide, or gallium indium phosphide. The material for forming the substrate 10 may be doped with p-type impurities or n-type impurities, or undoped. In addition, the substrate 10 may be a bulk silicon substrate, a silicon-on-insulator (SOI) substrate, or a germanium-on-insulator (GOI) substrate. Other suitable materials for the substrate 10 are within the contemplated scope of disclosure.

The FEOL part may include any suitable elements such as active devices (for example, transistors such as fin-type field-effect transistors (FinFET), nanosheet semiconductor devices, e.g. gate-all-around-field-effect transistors (GAAFET), forksheet-based devices, complementary transistors (CFET), or the like), passive devices (for example, capacitors, resistors, or the like), decoders, amplifiers, other suitable devices, and combinations thereof. Other suitable elements for the FEOL part are within the contemplated scope of disclosure.

The ILD layer 21 may include a low-k material, carbon-doped hydrogenated silicon oxide ($SiO_xC_yH_z$), silicon oxide ($SiO_x$), silicon carbon nitride (SiCN), oxygen-doped carbide (ODC), nitrogen-doped carbide (NDC), tetraethyl orthosilicate (TEOS), silicon nitride ($SiN_x$), or the like, or combinations thereof. The ILD layer 21 may have a single-layer structure, or a multi-layered structure. The ILD layer 21 may be formed by one or more deposition processes (such as chemical vapour deposition (CVD), atomic layer deposition (ALD), other suitable processes, or combinations thereof. Other suitable materials, and/or configuration, and/or method for forming the ILD layer 21 are within the contemplated scope of disclosure.

The glue layer 22 may serve as a conduction layer and/or an adhesion layer between the ILD layer 21 and the first interconnect material layer 23A. The glue layer 22 may include an electrically conducting material, or an adhesive material, such as tantalum (Ta), tantalum nitride (TaN), cobalt (Co), ruthenium (Ru), titanium (Ti), titanium nitride (TiN), self-assembled monolayer (SAM), manganese nitride ($MnN_x$), aluminum (Al), molybdenum (Mo), iridium (Ir), rhodium (Rh), graphene, or the like, or combinations thereof, but are not limited thereto. The glue layer 22 may be formed by one or more deposition processes (such as chemical vapour deposition (CVD), atomic layer deposition (ALD), other suitable processes, or combinations thereof. Other suitable materials and/or method for forming the glue layer 22 are within the contemplated scope of disclosure.

The first interconnect material layer 23A may include a first electrically conductive material, and may be formed into conductive lines in subsequent steps. In some embodiments, the first interconnect material layer 23A may include copper (Cu), ruthenium (Ru), tungsten (W), titanium (Ti), aluminum (Al), cobalt (Co), molybdenum (Mo), iridium (Ir), rhodium (Rh), or the like, or combinations thereof. The first interconnect material layer 23A may be formed by one or more deposition processes (such as chemical vapour deposition (CVD), atomic layer deposition (ALD), other suitable processes, or combinations thereof. Other suitable materials for the first interconnect material layer 23A are within the contemplated scope of disclosure.

Other elements and/or configuration of the stack are within the contemplated scope of the present disclosure.

Figure 3:
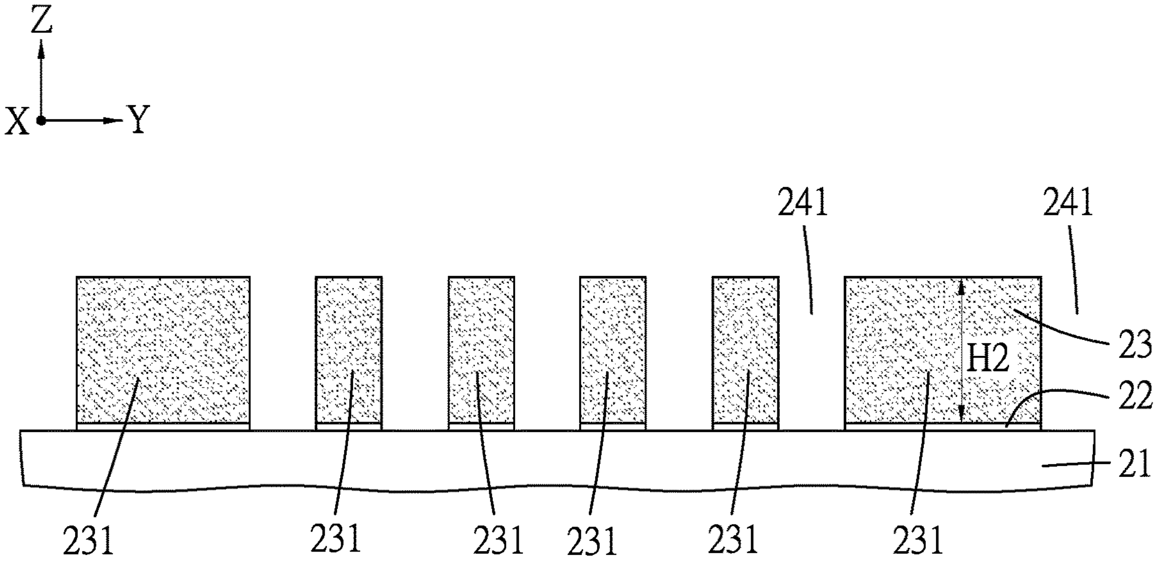

Please note that in FIG. 3 and subsequent figures, the substrate 10 is not shown for the sake of brevity.

Figure 25:
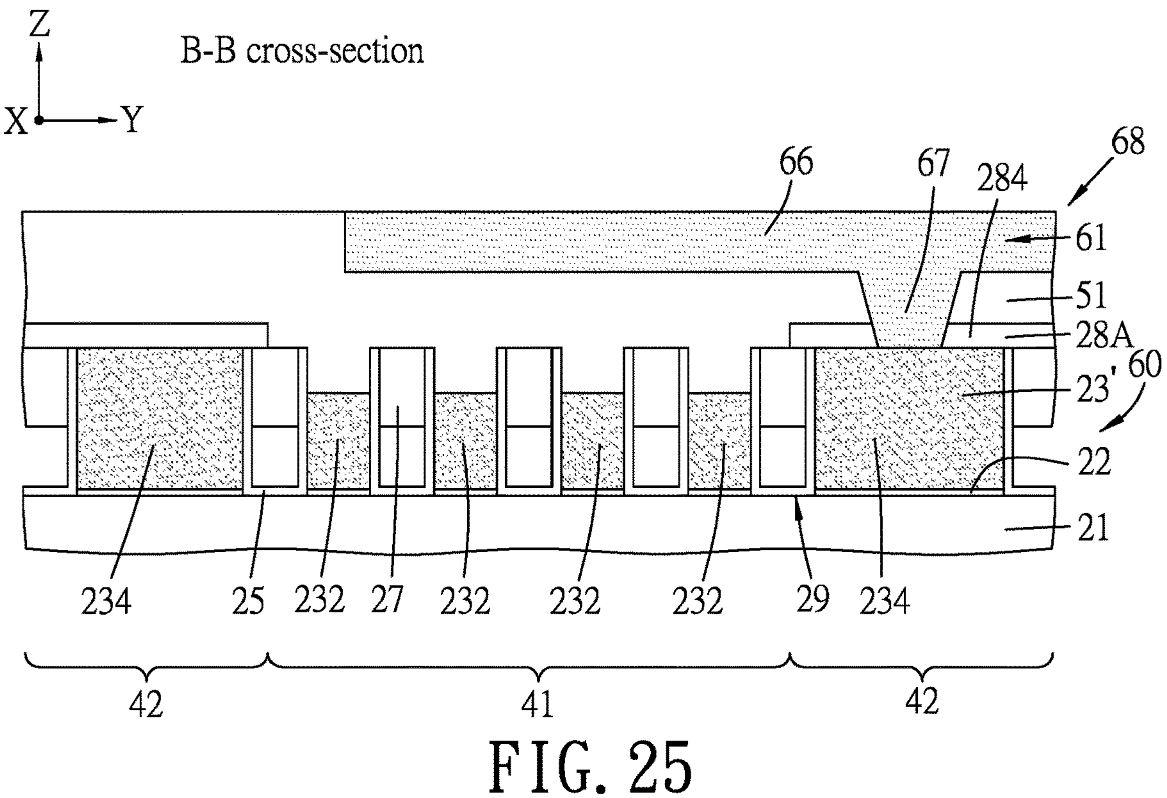

Referring to FIG. 3, the first interconnect material layer 23A (see FIG. 2) is formed into a plurality of lines 231 (which are formed into first and second lines 232, 234 as shown in FIG. 25), thereby forming the first layer 23. The lines 231 are each elongated in an X direction, and spaced apart from each other in a Y direction transverse (e.g., perpendicular to) to the X direction. In some embodiments, the lines 231 may have a pitch ranging from about 12 nm to about 25 nm, but are not limited thereto. Each of the lines 231 may be formed with the second height (H2) along a Z direction transverse (e.g., perpendicular to) to the X direction and the Y direction. In some embodiments, the second height (H2) ranges from about 120 Å to about 300 Å, but is not limited thereto. Other ranges for the second height (H2) are within the contemplated scope of the present disclosure. In some embodiments, the lines 231 (formed from the first interconnect material layer 23A) are made of a metallic material, and may be referred as metal lines or the conductive lines. Other materials for forming the lines 231 are within the contemplated scope of the present disclosure.

The lines 231 are spaced from each other by trenches 241. The lines 231 and the trenches 241 may be formed by the following: forming a patterned mask (not shown, which may be a patterned hard mask or a patterned photoresist) over the first interconnect material layer 23A; patterning the first interconnect material layer 23A through the patterned mask using a suitable etching process; and removing the patterned mask. In some embodiments, formation of the patterned photoresist may involve coating a photoresist, exposing the photoresist through a photomask, developing the photoresist to form a patterned photoresist, and/or other suitable processes, but are not limited thereto. In some embodiments, portions of the glue layer 22 may also be removed during the patterning process so as to expose portions of the ILD layer 21 underneath. Other methods for forming the lines 231 and the trenches 241 are within the contemplated scope of the present disclosure.

Figure 4:
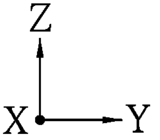
Figure 4:
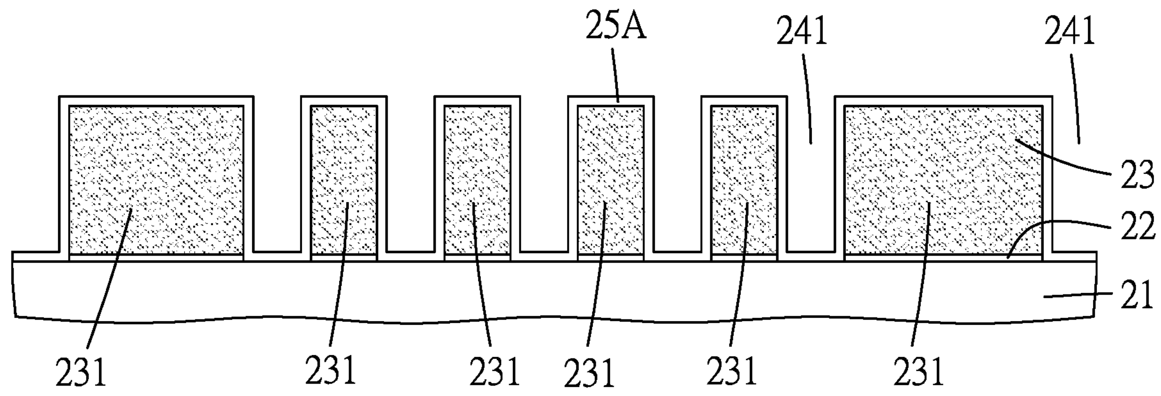

Referring to FIG. 4, a liner material layer 25A is formed over the lines 231, and in the trenches 241 over the exposed portions of the ILD layer 21. In some embodiments, the liner material layer 25A may include oxygen-doped carbide (ODC), a dielectric oxide (e.g., a metal oxide or silicon oxide), silicon nitride ($SiN_x$), graphene, or the like, or combinations thereof, but are not limited thereto. In some embodiments, the liner material layer 25A is formed in a conformal manner using one or more deposition processes (such as chemical vapour deposition (CVD), atomic layer deposition (ALD), other suitable processes, or combinations thereof). That is, the liner material layer 25A may be conformally formed over top surfaces and side surfaces of the lines 231, and over the exposed portions of the ILD layer 21. Other materials, and/or methods for forming the liner material layer 25A are within the contemplated scope of the present disclosure.

Figure 5:
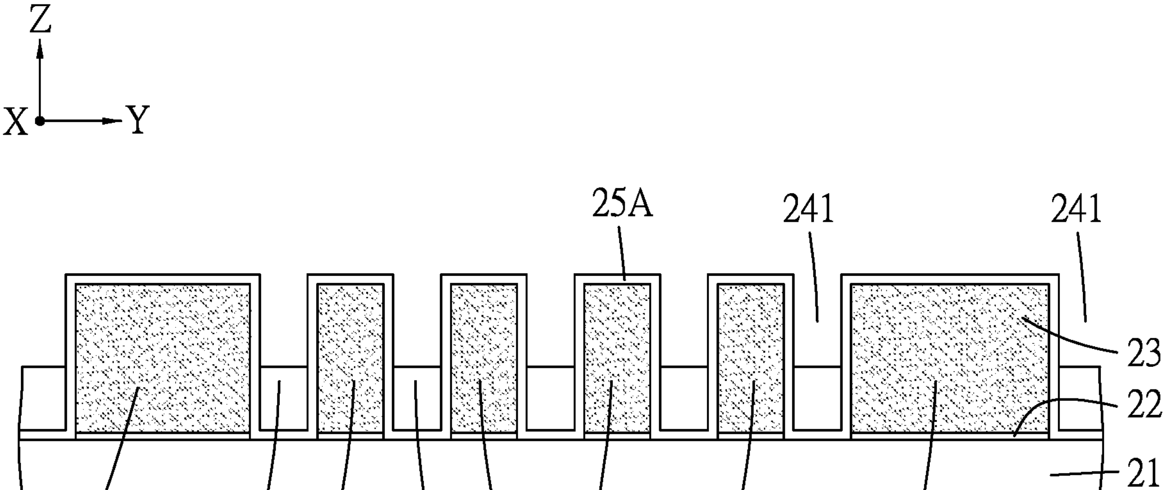

Referring to FIG. 5, sacrificial elements 26 are formed on the liner material layer 25A at bottoms of the trenches 241. The sacrificial elements 26 will be removed to leave air gaps at bottoms of the trenches 241 in subsequent sub-step. In some embodiments, the sacrificial elements 26 may include a polymer. The polymer may be a hydrocarbon-based polymer, but is not limited thereto. In other embodiments, the sacrificial elements 26 may include polyurea, polylactic acid, polycaprolactone, poly(ethylene oxide), polyacrylate, polyvinyl alcohol, or the like, or combinations thereof. In some embodiments, the sacrificial elements 26 are formed by (i) spin coating the material(s) for forming the sacrificial elements 26 over the liner material layer 25A to fill the trenches 241 at room temperature, (ii) performing a curing process to cure the material for forming the sacrificial elements 26 (e.g., at about 100° C. to about 250° C., but not limited thereto), and (iii) recessing the cured material to form the sacrificial elements 26 in the trenches 241. The sacrificial elements 26 may be formed with a predetermined height according to practical needs. Other materials, and/or processes, and/or conditions suitable for forming the sacrificial elements 26 are within the contemplated scope of the present disclosure.

Referring to FIG. 6, dielectric elements 27 are formed on the sacrificial elements 26 to fill the trenches 241. Possible materials of the dielectric elements 27 may be similar to that of the ILD layer 21, and thus are not described for the sake of brevity. In some embodiments, the dielectric elements 27 may be made of a material same as or different from that of the ILD layer 21. The dielectric elements 27 may each have a single-layer structure, or a multi-layered structure. In certain embodiments, upper surfaces of the dielectric elements 27 may be flush with upper surfaces of the lines 231. The dielectric elements 27 may be formed by depositing the material(s) for forming the dielectric elements 27 over the structure shown in FIG. 5 using one or more deposition processes (such as chemical vapour deposition (CVD), atomic layer deposition (ALD), other suitable processes, or combinations thereof), followed by removing excesses of the material(s) using one or more planarization processes such as chemical-mechanical planarization process (CMP), but is not limited thereto, so as to expose the lines 231. After the one or more planarization processes, the dielectric elements 27 are respectively formed in the trenches 241 and the liner material layer 25A shown in FIG. 5 is formed into a plurality of liners 25 which are respectively formed along trench defining walls of the trenches 241. Other suitable materials, and/or configurations, and/or methods for forming the dielectric elements 27 and/or the liners 25 are within the contemplated scope of disclosure.

Referring to FIG. 7, the sacrificial elements 26 (see FIG. 6) formed at the bottoms of the trenches 241 are removed to form air gaps 242. As such, the dielectric units 29 are formed, each of which includes one dielectric element 27, one liner 25 and one air gap 242. The air gap 242 and the dielectric element 27 are separated from adjacent ones of the lines 231 by the liner 25. Two adjacent ones of the first lines 232 and the second lines 231 are spaced apart from each other by a corresponding one of the dielectric units 29. Each of the dielectric units 29 has an upper surface at a level which is the same as that of an upper surface of each of the lines 231. In some embodiments, the sacrificial elements 26 are removed by, for example, a thermal treatment, but is not limited thereto. In other embodiments, the sacrificial elements 26 may merely be partially removed to respectively remain parts of which at the bottom of the trenches 241. Other suitable materials, and/or configurations, and/or methods for forming the dielectric units 29 are within the contemplated scope of disclosure.

In some embodiments, the formation of the air gaps 242 is omitted, and sub-steps described with reference to FIGS. 5 to 7 may be modified by directly forming the dielectric elements 27 filling the entire trenches 241.

By completing the sub-step described with reference to FIG. 7, the first layer 23 and the dielectric units 29 are formed on the base structure. The first layer 23 includes a plurality of the lines 231 that are spaced apart from each other by the dielectric units 29. The first layer 23, and any other elements formed thereon opposite to the ILD layer 21, may be considered as another portion of the back-end-of-line (BEOL) part. The first layer 23 will be formed into a patterned first layer 23' (see FIG. 24) in subsequent steps, in which the patterned first layer 23' is equivalent to a metal portion of the first interconnect level structure 60 described, or may be referred as a critical interconnect layer Mx. The base structure includes the substrate 10 (see FIG. 2), and the FEOL part (not shown), the ILD layer 21, the patterned glue layer 22 (see FIG. 7).

The first layer 23 may include additional elements according to practical needs. Other materials, and/or methods, and/or configurations for forming the first layer 23 are within the contemplated scope of the present disclosure.

Figure 9:
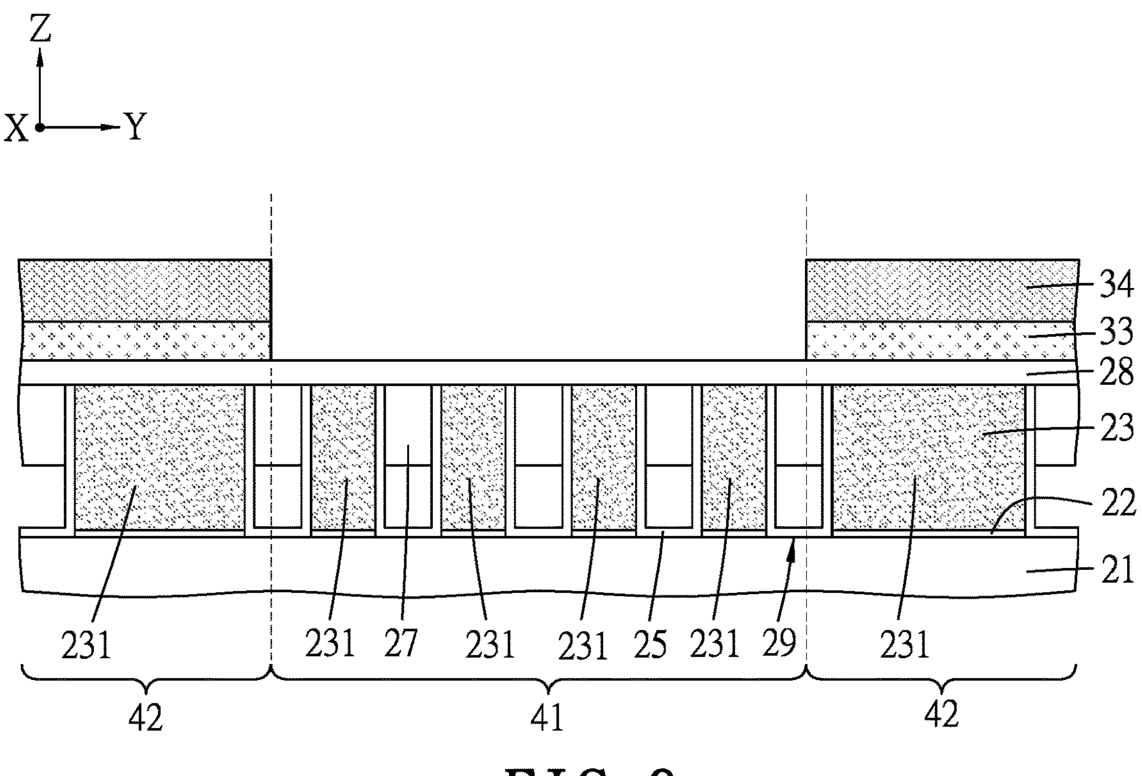

Referring to FIG. 1 and the example illustrated in FIG. 9, the method proceeds to step 102, where an etch stop layer 28 is formed over the first layer 23 and the dielectric units 29, and a patterned first mask 33 is formed over the etch stop layer 23. The patterned first mask 33 exposes a first portion of the etch stop layer 28, and covers a second portion of the etch stop layer 28. The first and second portions of the etch stop layer 28 respectively correspond in position to the first region 41 (which may be known as a relatively low capacitance region) and a second region 42 (which may be known as a relatively low resistance region) of the patterned first layer 23' (i.e., the metal portion of the first interconnect level structure 60, see FIG. 24) formed in subsequent step. In some embodiments, the second lines 234 may each have a width wider than a width of each of the first lines 232 in the Y direction.

Figure 8:
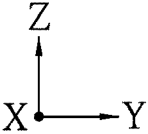
Figure 8:
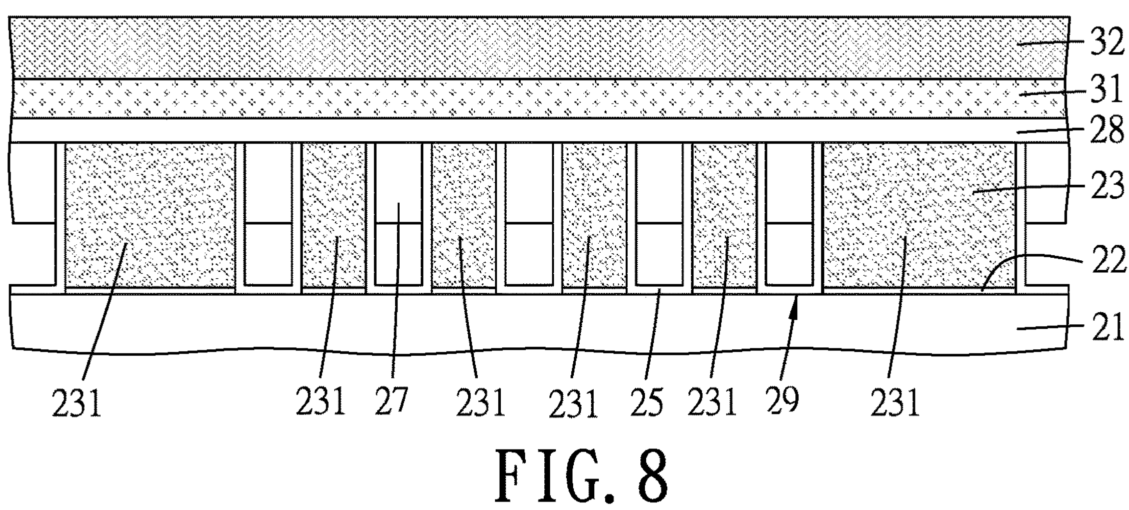

Step 102 may include sub-steps illustrated in FIGS. 8 to 9 in accordance with some embodiments.

Referring to FIG. 8, the etch stop layer 28, a first mask layer 31, and a first photoresist layer 32 are sequentially formed over the first layer 23. The etch stop layer 28 includes a high k material, silicon carbon nitride (SiCN), carbon-doped hydrogenated silicon oxide ($SiO_xC_yH_z$), silicon oxide ($SiO_x$), silicon nitride ($SiN_x$), aluminum oxynitride ($AlO_xN_y$), a metal oxide (e.g., aluminum oxide ($AlO_x$), carbon-doped aluminum oxide (C:AlO) zirconium oxide ($ZrO_x$)), oxygen-doped carbide (ODC), nitrogen-doped carbide (NDC), tetraethyl orthosilicate (TEOS), or the like, or combinations thereof.

The etch stop layer 28 may have a single-layer structure, or a multi-layered structure. The etch stop layer 28 may be formed by one or more deposition processes (such as chemical vapour deposition (CVD), atomic layer deposition (ALD), other suitable processes, or combinations thereof. Other suitable materials, and/or configuration, and/or method for forming the etch stop layer 28 are within the contemplated scope of disclosure.

The first mask layer 31 may include dielectric materials, such as silicon oxide, silicon nitride, aluminum oxide, silicon oxynitride, or the likes, or combinations thereof, but are not limited thereto, and may be formed by one or more deposition processes (such as chemical vapour deposition (CVD), atomic layer deposition (ALD), other suitable processes, or combinations thereof. The first photoresist layer 32 may include any suitable light-sensitive material and may be formed using spin coating or other suitable processes. One may decide to adopt a positive photoresist or a negative photoresist material according to practical needs. In some embodiments, the first photoresist layer 32 may have a single-layer structure. In other embodiments, the first photoresist layer 32 may have a multi-layered structure. As the first photoresist layer 32 is formed into a patterned first photoresist 34 (see FIG. 9), and an underlying element is patterned through the patterned photoresist 34, such multi-layered structure helps controls profile (e.g. critical dimension) of opening(s) formed in the underlying element.

Referring to FIG. 9, in some embodiments, the first photoresist layer 32 (see FIG. 8) is exposed through a photomask (not shown), and is then developed to form a patterned first photoresist 34. The first mask layer 31 (see FIG. 8) is patterned through the patterned first photoresist 34 to form the patterned first mask 33 with an opening that exposes the first portion of the etch stop layer 28. The patterned first mask 33 covers the second portion of the etch stop layer 28. Other suitable materials, and/or configurations, and/or methods for forming the patterned first mask 33 are within the contemplated scope of disclosure.

After formation of the patterned first mask 33, the patterned first photoresist 34 may be removed by any suitable methods, such as one or more stripping and/or ashing processes, but are not limited thereto.

Figure 14:
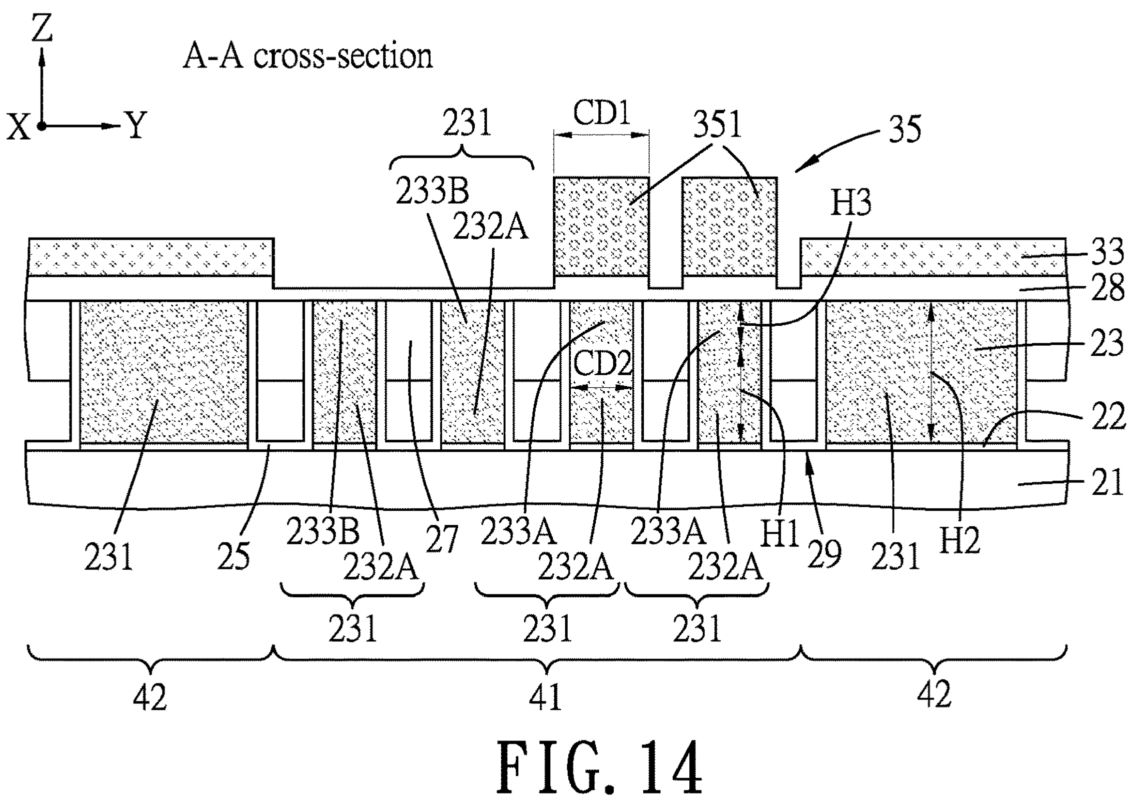
Figure 15:
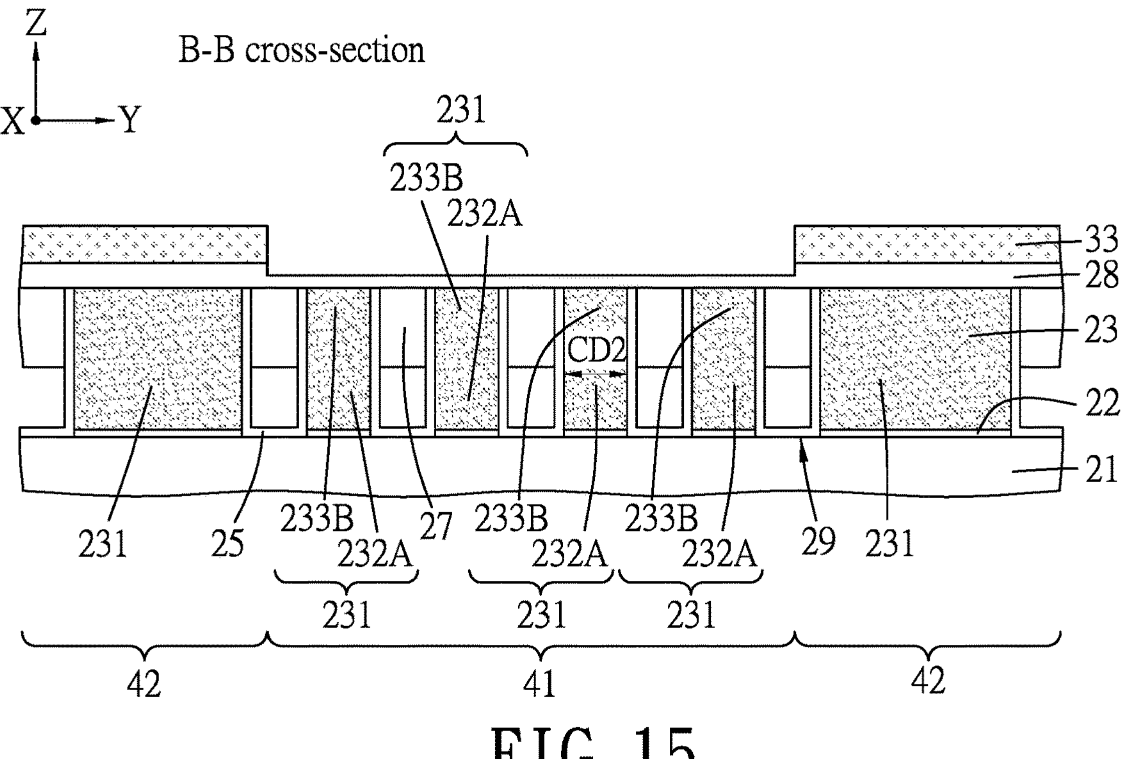

Referring to FIG. 1 and the examples illustrated in FIGS. 14 and 15, the method proceeds to step 103, where a patterned second mask 35 is formed on the first portion of the etch stop layer 28, and is in position corresponding to predetermined ones of the lines 231 at the first region 41. FIG. 14 illustrates a cross-sectional view of the structure along a Y-Z plane at which the patterned second mask 35 is formed in accordance with some embodiments, and FIG. 15 illustrates another cross-sectional view of the structure along another Y-Z plane at which the patterned second mask 35 is absent in accordance with some embodiments.

Each of the lines 231 at the first region 41 may have a bottom segment 232A and an upper segment. For each of the predetermined ones of the lines 231, the upper segment includes a first part 233A (see FIG. 14) that is covered by the patterned second mask 35 and a second part 233B (see FIG. 15) that is not covered by the patterned second mask 35. For each remaining line 231, the upper segment includes a second part 233B only (i.e., each remaining line 231 is not covered by the patterned second mask 35). The first parts 233A of the predetermined ones of the lines 231 may later serve as the connection portions 233 (see FIG. 24) formed in subsequent step. The connection portions 233 each contributes to a part of a corresponding via feature that interconnects different interconnect level structures (e.g., first and second interconnect level structures 60, 61 as shown in FIG. 24). As exemplarily shown in FIG. 14, at the first region 41, the two rightmost lines 231 serve as the predetermined ones of lines 231. In other embodiments, positions of the predetermined ones of the lines 231, and/or positions of the first parts 233A, and/or positions of the second parts 233B may be varied based on practical needs. The second parts 233B of the lines 231 at the first region 41 are removed in subsequent step.

In some embodiments, step 103 may include sub-steps illustrated in FIGS. 10 to 15 in accordance with some embodiments.

Figure 10:
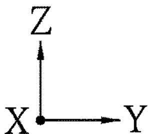
Figure 10:
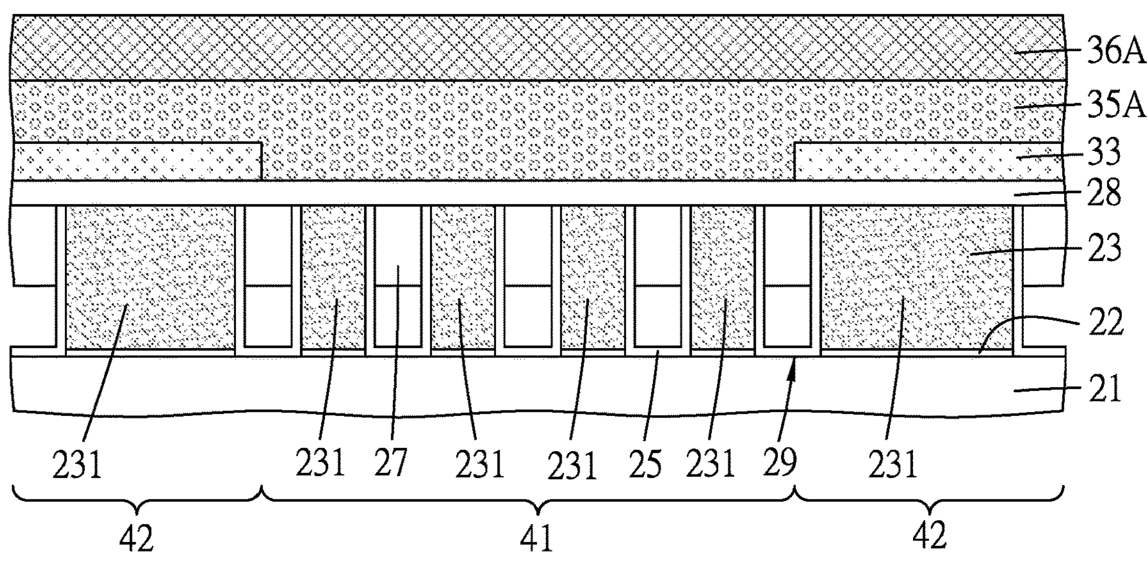

Referring to FIG. 10, a second mask layer 35A and a second photoresist layer 36A are sequentially formed over the patterned first mask 33 and the etch stop layer 28. The second mask layer 35A may fill the opening of the patterned first mask 33. In some embodiments, possible processes and materials for forming the second mask layer 35A are similar to those for the first mask layer 31, and thus are not described for the sake of brevity. In some embodiments, possible processes and materials for forming the second photoresist layer 36A are similar to those for the first photoresist layer 32 described with reference to FIG. 8, and the details thereof are omitted for the sake of brevity. Other suitable materials, and/or configuration, and/or method for forming the second mask layer 35A and the second photoresist layer 36A are within the contemplated scope of disclosure.

Figure 11:
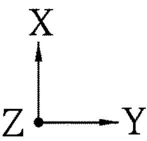
Figure 11:
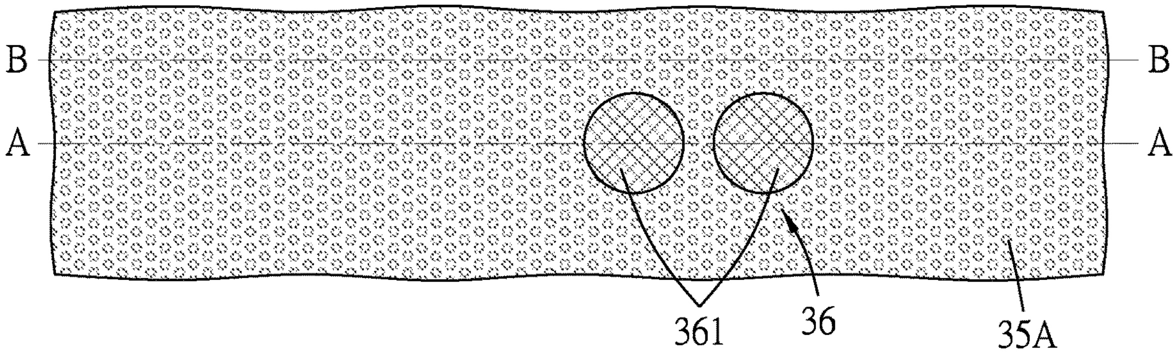
Figure 12:
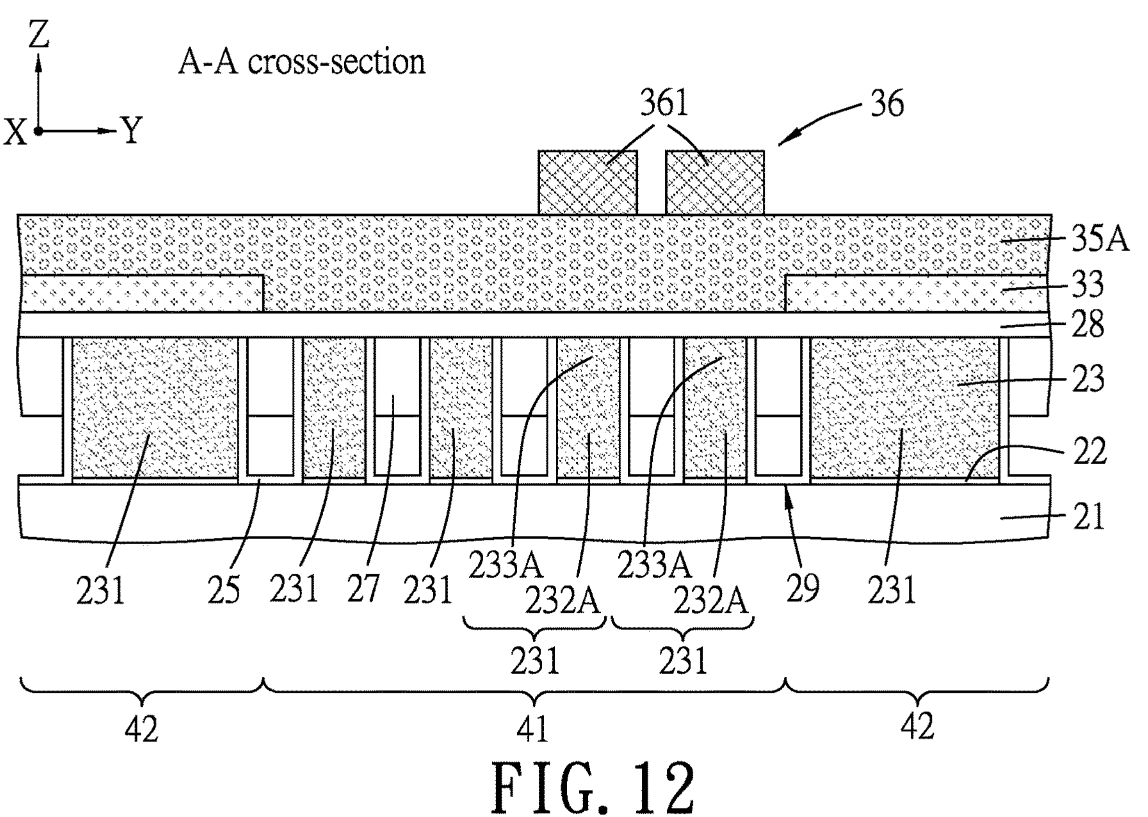
Figure 13:
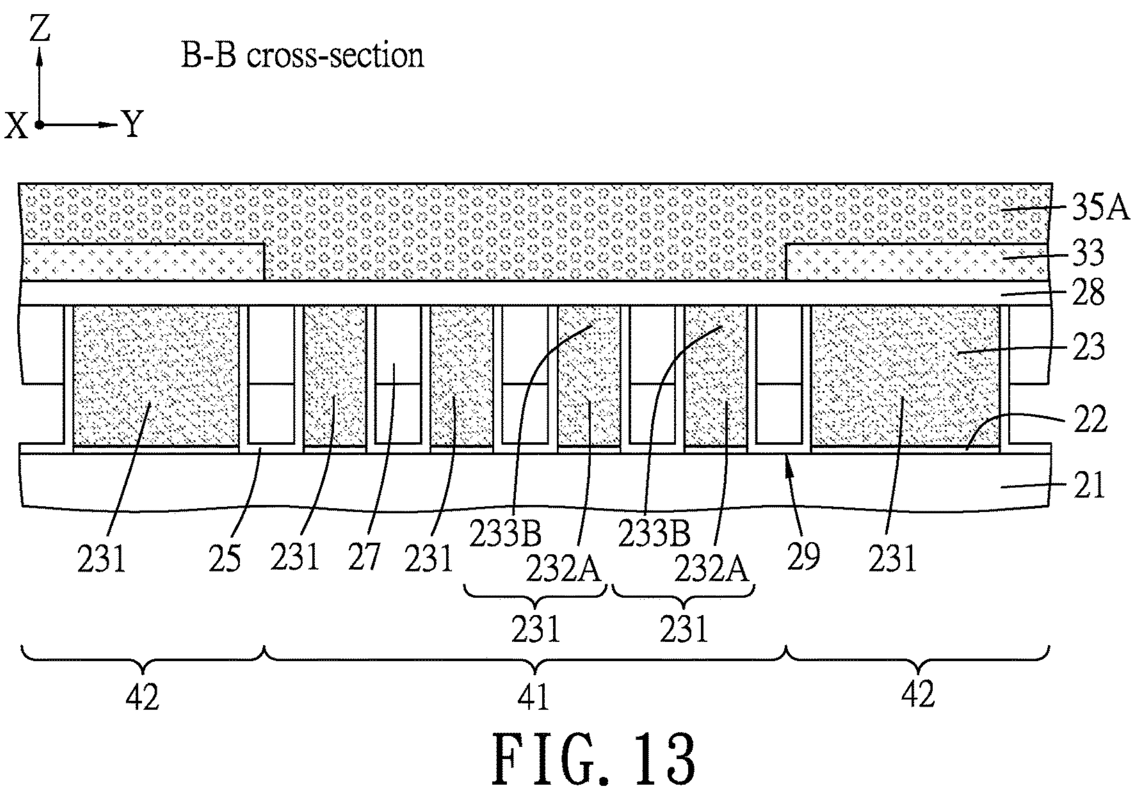

Referring to FIGS. 11 to 13, the second photoresist layer 36A (see FIG. 10) is formed into a patterned second photoresist 36. Specifically, the patterned second photoresist 36 includes a plurality of sections 361 that are in positions corresponding to the first parts 233A of the predetermined ones of the lines 231. FIG. 11 shows a top view of the structure after formation of the patterned second photoresist 36. FIG. 12 is a cross-sectional view of the structure along a line A-A shown in FIG. 11, showing the sections 361 of the patterned second photoresist 36 formed in positions corresponding to the first parts 233A. FIG. 13 is a cross-sectional view of the structure along a line B-B shown in FIG. 11, illustrating a place where the patterned second photoresist 36 is absent.

In some embodiments, formation of the patterned second photoresist 36 may be a photolithography process, but is not limited thereto. For instance, the second photoresist layer 36A (see FIG. 10) may be exposed through a photomask (not shown), and then developed and formed into the patterned second photoresist 36. In other embodiments, the second photoresist layer 36A may be patterned into a patterned layer (not shown) with openings in positions corresponding to the sections 361, and then a masking material may be filled in the openings, followed by removing the patterned layer so as to obtain masking sections which can also be represented by the sections 361 shown in FIG. 12 . . . . Other suitable methods for forming the patterned second photoresist 36 are within the contemplated scope of the present disclosure.

Referring to FIGS. 14 and 15, the second mask layer 35A (see FIGS. 12 and 13), is patterned into a patterned second mask 35 through the patterned second photoresist 36. The patterned second photoresist 36 may serve as a cover mask in formation of the patterned second mask 35. Similar to the patterned second photoresist 36, the patterned second mask 35 includes a plurality of sections 351 that are in positions corresponding to the first parts 233A of the predetermined ones of the lines 231.

FIG. 14 illustrates the cross-sectional view of the structure subsequent to that shown in FIG. 12 (i.e., along the line A-A shown in FIG. 11), showing the sections 351 of the patterned second mask 35 formed in positions corresponding to the first parts 233A in accordance with some embodiments. FIG. 15 illustrates the cross-sectional view of the structure subsequent to that shown in FIG. 13 (i.e., along the line B-B shown in FIG. 11), illustrating a place where the patterned second mask 35 is absent in accordance with some embodiments.

In some embodiments, during patterning of the second mask layer 35A into the patterned second mask 35, the etch stop layer 28 exposed from the patterned first mask 33 and the patterned second mask 35 is partially etched. As shown in FIGS. 14 and 15, after step 103, parts of the etch stop layer 28 that are not covered by the patterned first mask 33 and that are not covered by the patterned second mask 35 have a reduced height along the Z direction when comparing with the structure shown in FIGS. 12 and 13.

The patterning process may be any suitable process, such as etching (e.g., dry etching, wet etching, anisotropic etching, other suitable techniques, or combinations thereof), but is not limited thereto. Other suitable methods for forming the patterned second mask 35 are within the contemplated scope of the present disclosure.

In certain embodiments, the sections 351 may each have a first width (CD1), and the first parts 233A of the predetermined ones of the lines 231 underneath the sections 351 may each have a second width (CD2) smaller than the first width (CD1). As such, even in case that any one of the sections 351 is in slight misalignment with a corresponding one of the first parts 233A, the section(s) 351 could still cover the corresponding first part(s) 233A as much as possible (i.e., overlay window is improved), the first parts 233A are less likely to be etched during removal of the second parts 233B, and thus uniformity of a width of the connection portions 233 (see FIG. 25) formed form the first parts 233A is improved (i.e., improved critical dimension uniformity). In some embodiments, portions of the etch stop layer 28 covered by the sections 351 may each have a width same as that of the sections 351.

Please note that the number of the sections 361 and the number of the sections 351 formed are determined according to the amount of the connection portions 233 desired. In some embodiments, as shown in FIG. 24, there are two connection portions 233, and thus two sections 361 are formed as shown in FIGS. 11 and 12, and two sections 351 are formed as shown in FIG. 14. In other embodiments, there may be only one, or more than two of the connection portions 233. In some embodiments, as shown in FIGS. 11 and 12, the sections 361 are each formed in a pillar shape (with a circular cross-section along a X-Y plane), as well as the sections 351 (see FIG. 14), but are not limited thereto. In other embodiments, the sections 361 may each be formed into different shapes according to practical needs or final product specification, as well as the sections 351. Other suitable configurations for the patterned second photoresist 36 and the patterned second mask 35 are within the contemplated scope of the present disclosure.

By completing steps 102 and 103, the obtained patterned first and second masks 33, 35 cooperatively form a patterned masking unit in positions corresponding to the lines 231 at the second region 42, and the first parts 233A of the predetermined ones of the lines 231 at the first region 41. The remaining parts of the lines 231 that are not covered by the patterned mask unit. e.g., the second parts 233B of the lines 231 at the first region 41, are to be recessed in subsequent step.

Figure 16:
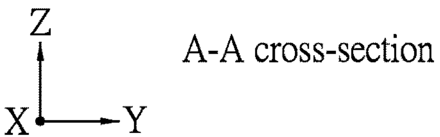
Figure 16:
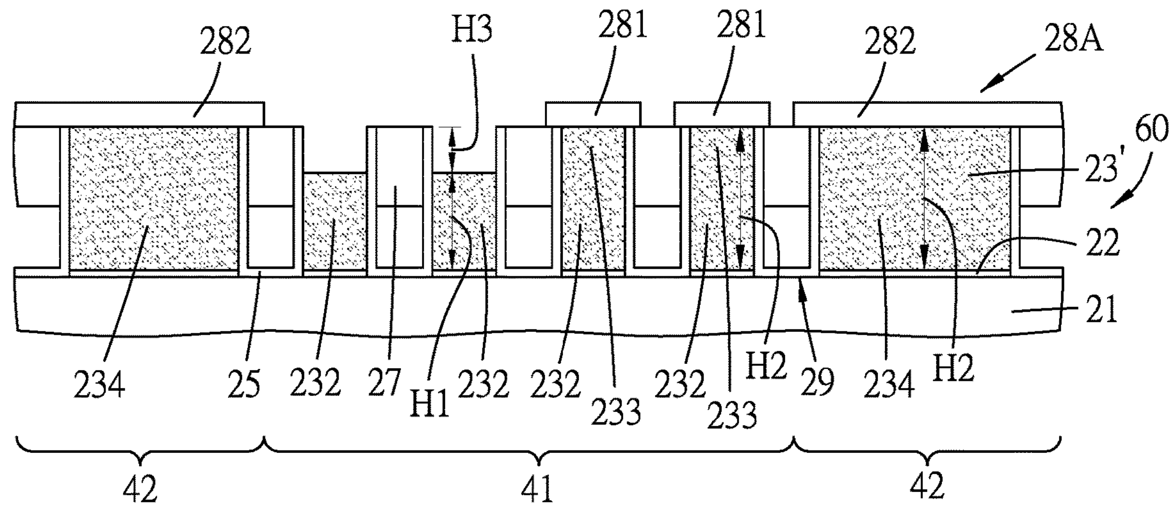
Figure 17:
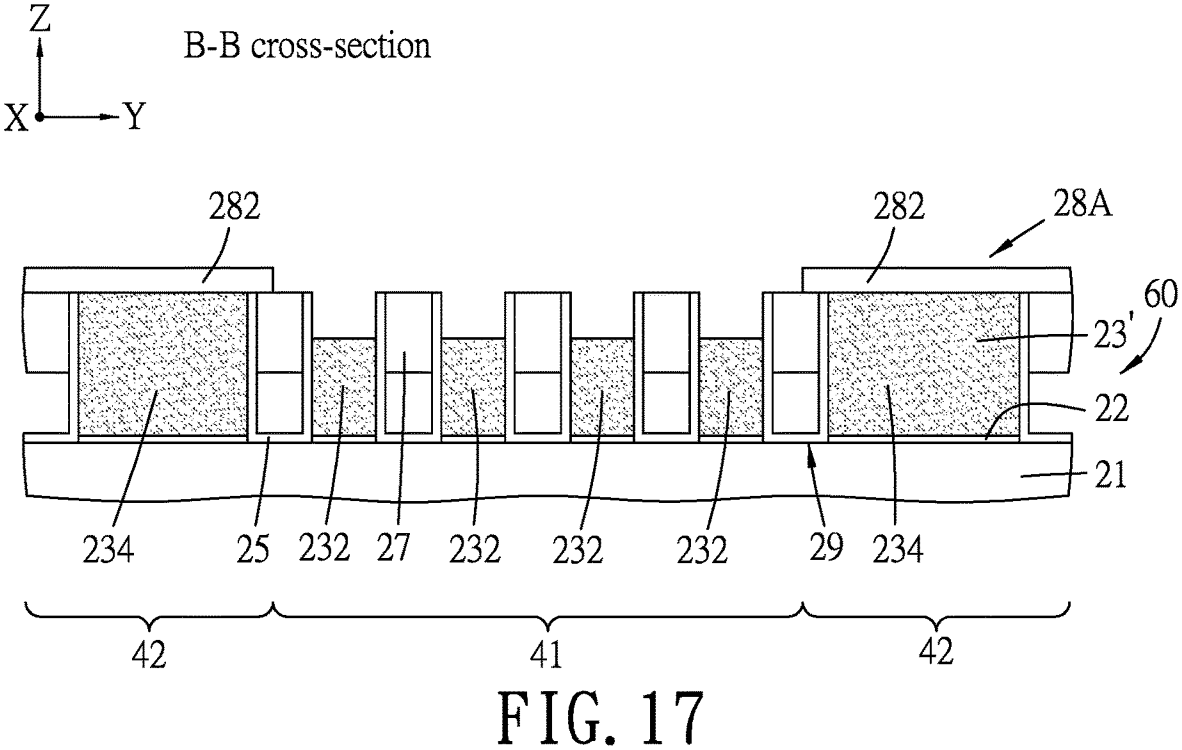

Referring to FIG. 1 and the examples illustrated in FIGS. 14 to 15 and 16 to 17, the method proceeds to step 104, where the first layer 23 is patterned to form a patterned first layer 23'. FIG. 16 illustrates the cross-sectional view of the structure subsequent to that shown in FIG. 14 in accordance with some embodiments. FIG. 17 illustrates the cross-sectional view of the structure subsequent to that shown in FIG. 15 in accordance with some embodiments.

Referring to FIGS. 14 and 15, before a patterning process for forming first lines 232 and second lines 234 in step 104, the first parts 233A of the predetermined ones of the lines 231 are respectively covered by the sections 351 of the patterned second mask 35; the second parts 233B of the lines 231 at the first region 41 are exposed from the patterned second mask 35; and the lines 231 at the second region 42 are covered by the patterned first mask 33. Each of the first and second parts 233A, 233B may have a third height (H3). The lower segment 232A of each of the lines 231 at the first region 41 for forming the first lines 232 may have a first height (H1). The line 231 may have a second height (H2), which is equivalent to a sum of the third height (H3) and the first height (H1). Each of the first, second, and third heights (H1, H2, H3) may be determined according to practical needs.

In step 104, the first layer 23 is subjected to the patterning process to form the patterned first layer 23', such that the lines 231 are selectively recessed through the patterned first and second masks 33, 35. At the first region 41, the second parts 233B of the lines 231 are removed, while the first parts 233A (see FIGS. 14 and 15) of the predetermined ones of the lines 231 are protected by the patterned second mask 35 and remain as the connection portions 233 (see FIGS. 16 and 17) having the third height (H3). In some embodiments, the third height (H3) may be greater than about 30 Å, and may range from about 30 Å to about 60 Å, from about 60 Å to about 90 Å, from about 90 Å to about 120 Å, or from about 120 Å to about 150 Å, but is not limited thereto. The lower segments 232A of the lines 231 at the first region 41 remain and serve as the first lines 232 having the first height (H1). As such, the connection portions 233, in combination with parts of predetermined first lines 232 (formed from the predetermined ones of the lines 231) disposed underneath serve as a non-recessed portion having the second height (H2), while the remaining parts of the predetermined first lines 232, and other first lines 232 (on which the connection portions 233 are not disposed thereon), serve as a recessed portion. At the second region 42, the lines 231 (see FIGS. 14 and 15) are protected by the patterned first mask 33, and thus are not recessed, such that the lines 231 serve as the second lines 234 (see FIGS. 12 and 13) having the second height (H2), or known as another non-recessed portion in the patterning process. The patterning process may be performed by any suitable etching process, such as dry etching, wet etching, anisotropic etching, other suitable techniques, or combinations thereof, but are not limited thereto. In some embodiments, a reagent used in the patterning process has different selectivity toward the materials of the lines 231 and the materials of the dielectric units 29, such that the dielectric units 29 substantially intact.

By completing step 104, the patterned first layer 23' including the relatively lower first lines 232, the relatively higher second lines 234, and the connection portions 233 respectively disposed on parts of predetermined ones of the first lines 232 is obtained. The first region 41 having such relatively lower first lines 232 may then serve as a relatively low capacitance region, while the second region 42 having such relatively higher second lines 234 may serve as a relatively low resistance region, which is conducive to achieving different product specification by varying configuration and/or height of first and second lines 232, 234. Each of the connection portions 233 and a corresponding one of the predetermined ones of the first lines 232 are integrally formed by patterning a corresponding one of the predetermined ones of lines 231 (see FIGS. 14 to 17). The first interconnect level structure 60 is obtained after obtaining the patterned first layer 23'. The first interconnect level structure 60 includes the patterned first layer 23' serving as the metal portion, and the dielectric units 29. Each of the first and second lines 232, 234 are separated from each other by the dielectric units 29, and the connection portions 233 are respectively disposed on parts of predetermined ones of the first lines 232. The connection portions 233 are formed in a self-aligned manner along the Y direction and each uses two adjacent ones of the dielectric units 29 as the spacers.

In some embodiments, prior to patterning the first layer 23, the etch stop layer 28 may be patterned first, such that portions thereof exposed from the patterned first and second masks 33, 35 are removed so as to expose the lines 231 underneath. Specifically, as shown in FIGS. 16 and 17, after step 104, the patterned etch stop layer 28A is obtained, which includes first sections 281 covering the connection portions 233 at the first region 41, and second sections 282 covering the second lines 234 at the second region 42. That is, parts of the first lines 232, that are not covered by the connection portions 233, are exposed from the patterned etch stop layer 28A (which is made of a high-k material), so as to further lower capacitance of the first interconnect level structure 60.

In some embodiments, after patterning the etch stop layer 28 and the first layer 23 in step 104, the patterned first and second masks 33, 35 are removed using any suitable methods.

Other suitable methods for forming the patterned first layer 23' and/or the first interconnect level structure 60 are within the contemplated scope of the present disclosure.

Figure 22:
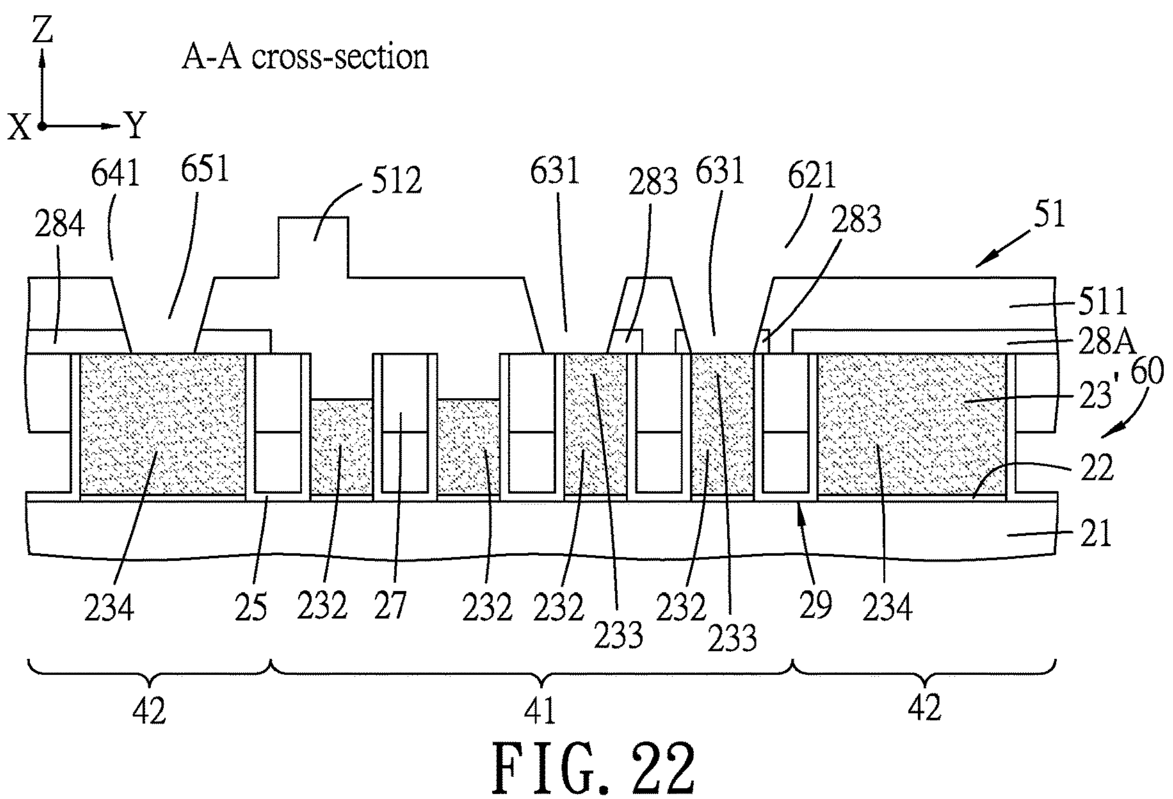
Figure 23:
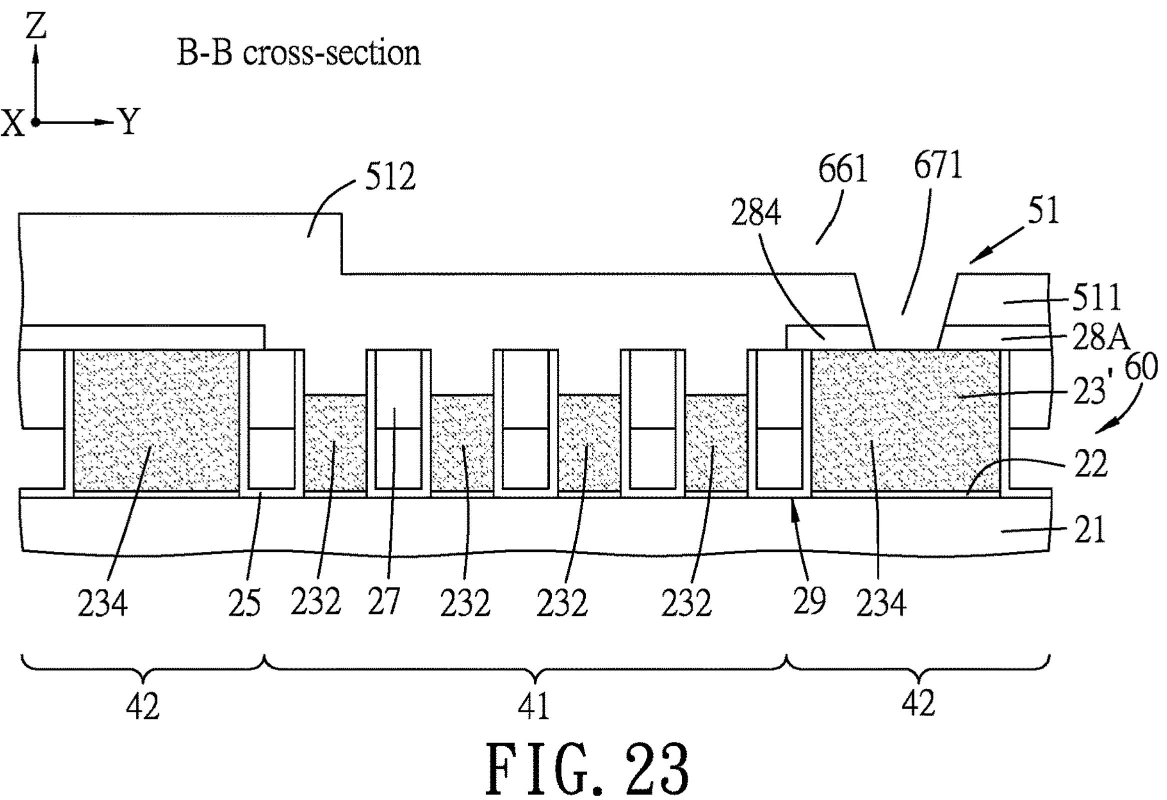

Referring to FIG. 1 and the example illustrated in FIGS. 22 and 23, the method proceeds to step 105, where a patterned dielectric layer 51 is formed over the patterned etch stop layer 28A and the first interconnect level structure 60. FIG. 22 illustrates the cross-sectional view of the structure, at which the connection portions 233 are formed in accordance with some embodiments. FIG. 23 illustrates the cross-sectional view of the structure, at which the connection portions 233 are absent in accordance with some embodiments.

In some embodiments, step 105 may include sub-steps illustrated in FIGS. 18 to 23 in accordance with some embodiments.

Figure 18:
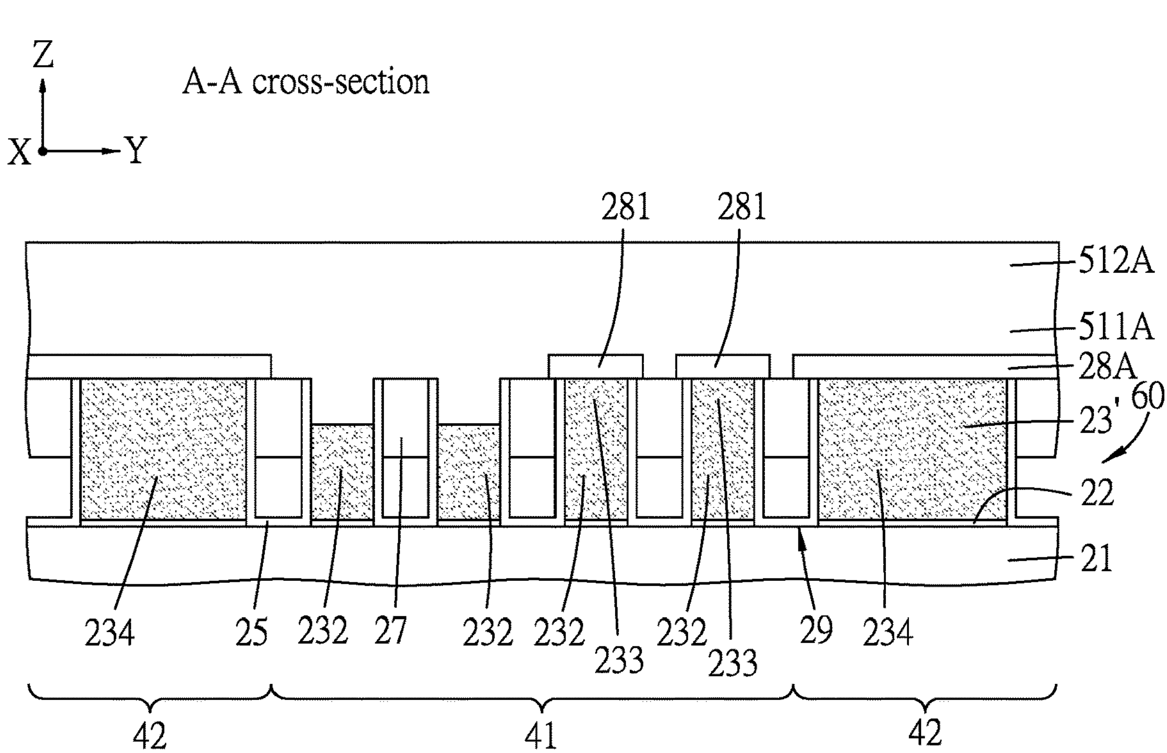
Figure 19:
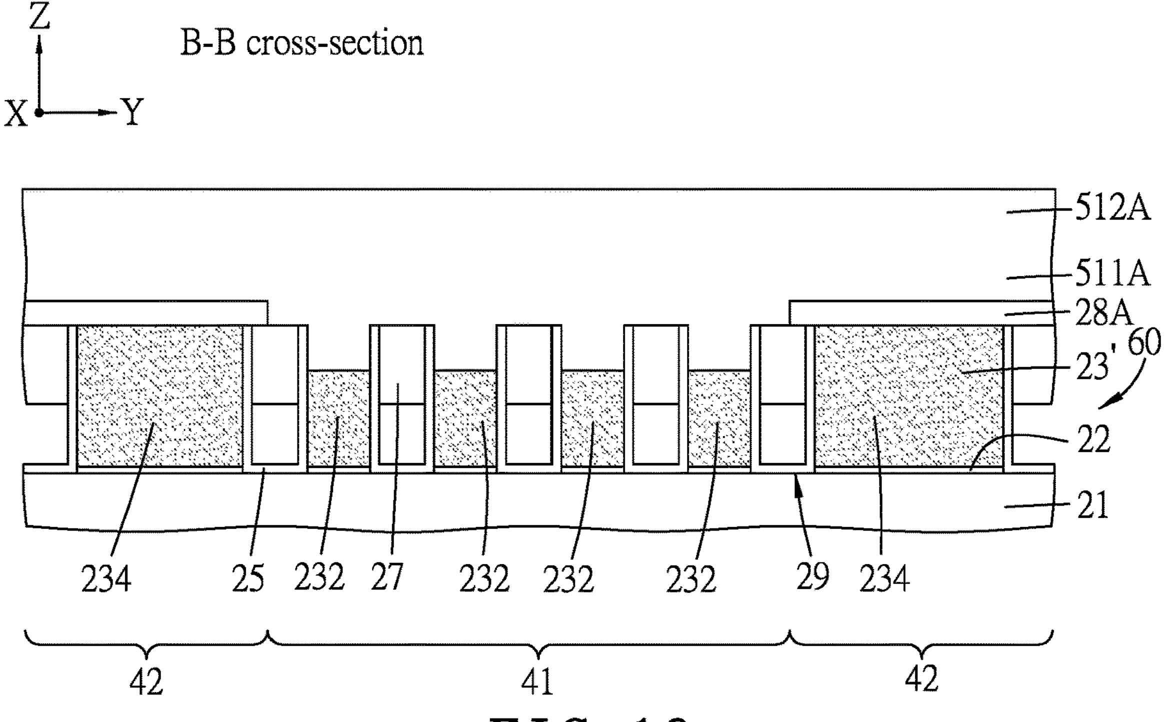

Referring to FIGS. 18 and 19, a dielectric material layer including a lower dielectric 511A and an upper dielectric 512A is formed over the patterned etch stop layer 28A and the first interconnect level structure 60. FIG. 18 illustrates the cross-sectional view of the structure at which the connection portions 233 are formed subsequent to that shown in FIG. 16. FIG. 19 illustrates the cross-sectional view of the structure at which the connection portions 233 are absent subsequent to that shown in FIG. 17.

Possible materials and configuration for the dielectric layer may be similar to those of the ILD layer 21, and thus are omitted for the sake of brevity. In some embodiments, the lower and upper dielectrics 511A, 512A may be made of the same material, and may be formed by one or more deposition processes (such as CVD, ALD, the likes, other suitable processes, or combinations thereof, but are not limited thereto). In some embodiments, the lower and upper dielectrics 511A, 512A may be sequentially formed over the patterned etch stop layer 28A and the first interconnect level structure 60. The lower dielectric 511A fills spaces between sections 281, 282 of patterned etch stop layer 28A, and spaces between adjacent ones of dielectric units 29 and above the recessed portion.

Figure 20:
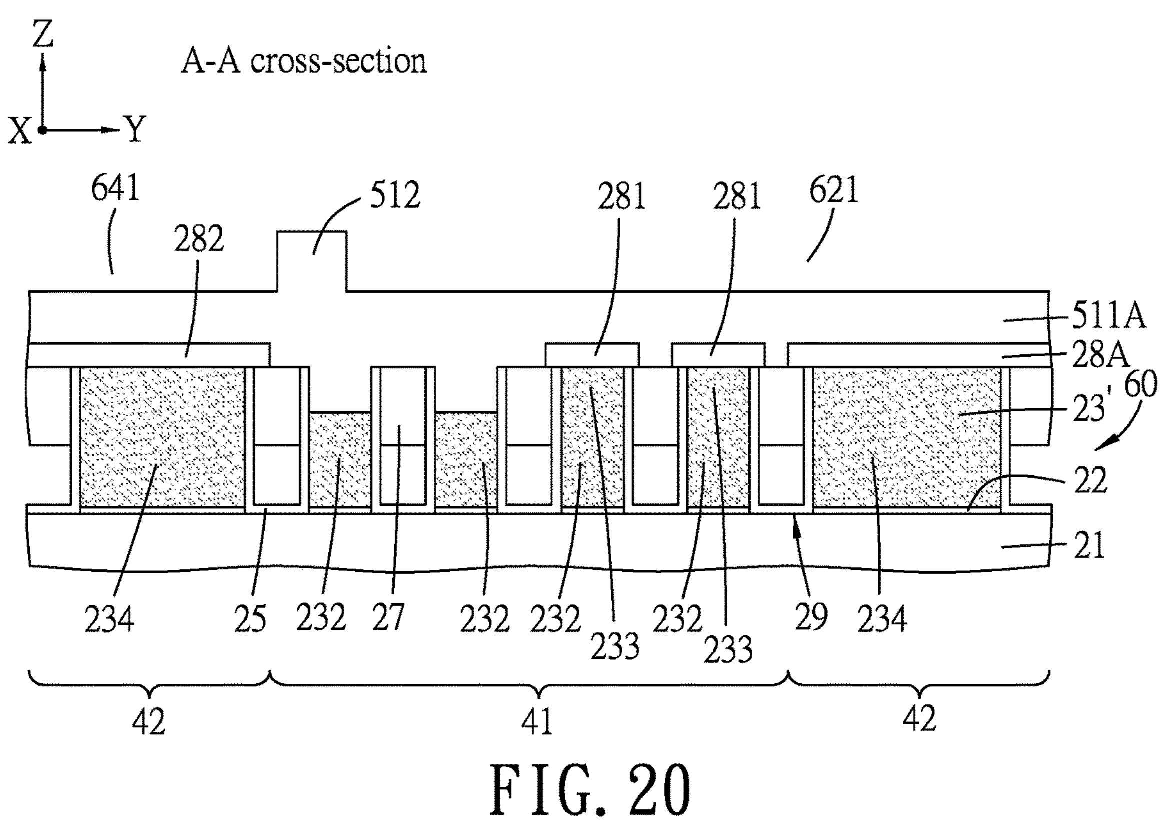
Figure 21:
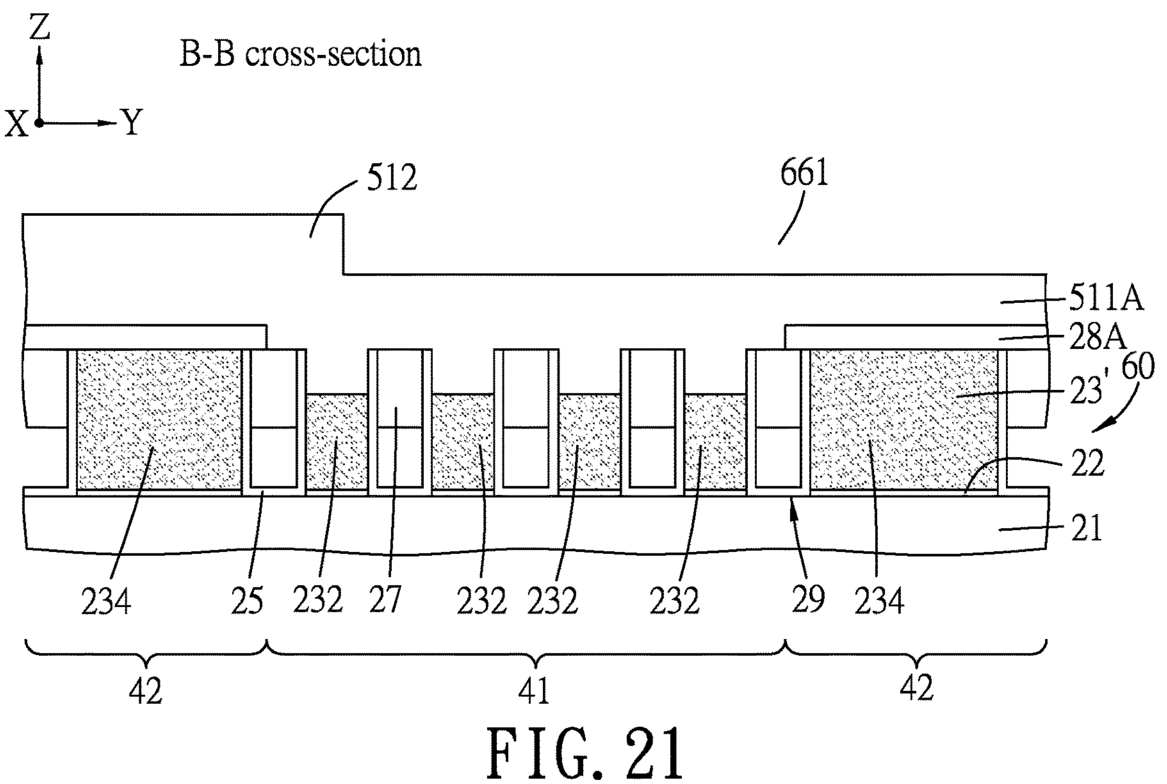

Referring to FIGS. 20 and 21, the upper dielectric 512A is patterned to form a patterned upper dielectric 512 that has upper cavities 621, 641, 661 exposing portions of the lower dielectric 511A. FIG. 20 illustrates the cross-sectional view of the structure at which the connection portions 233 are formed subsequent to that shown in FIG. 18 in accordance with some embodiments. FIG. 21 illustrates the cross-sectional view of the structure at which the connection portions 233 are absent subsequent to that shown in FIG. 19 in accordance with some embodiments. The patterning process may involve one or more etching processes (for example, but not limited to, a dry etching process, a wet etching process, or the likes, or combinations thereof) through a patterned mask (not shown).

Referring to FIGS. 22 and 23, the lower dielectric 511A is patterned through the upper cavities 621, 641, 661 to form a patterned lower dielectric 511 that has lower cavities 631, 651, 671 exposing portions of the first level interconnect structure 60. FIG. 22 illustrates the cross-sectional view of the structure at which the connection portions 233 are formed subsequent to that shown in FIG. 20 in accordance with some embodiments. FIG. 23 illustrates the cross-sectional view of the structure at which the connection portions 233 are absent subsequent to that shown in FIG. 21 in accordance with some embodiments. The patterning process may involve one or more etching processes (for example, but not limited to, a dry etching process, a wet etching process, or the likes, or combinations thereof) through a patterned mask (not shown).

Exemplarily shown in FIGS. 22 and 23, the lower cavities 631 respectively expose the connection portions 233, the lower cavity 651 exposes the leftmost second line 234, and the lower cavity 671 exposes the rightmost second line 234. The lower cavities 631 are in spatial communication with the upper cavity 621. The lower cavity 651 is in spatial communication with the upper cavity 641. The lower cavity 671 is in spatial communication with the upper cavity 661. Please note that amount and/or configuration of the upper and/or lower cavities 621, 641, 661, 631, 651, 671 may be adjusted according to practical needs. Referring to FIG. 22, there are two lower cavities 631 formed, which are formed to accommodate first vias 63 formed in subsequent step. Each of the lower cavities 631 extend from an upper surface of the patterned second dielectric 51 to a bottom surface of the patterned second dielectric 51. The right lower cavity 631 aligns with the connection portion 233 underneath by exposing the entire upper surface of the connection portion 233 underneath. The left lower cavity 631 exposes a portion of an upper surface of the connection portion 233 underneath, and a portion of an upper surface of an adjacent one of the dielectric unit 29, and such left lower cavity 631 is in slight misalignment with the connection portion 233 underneath, and in some embodiments, may be considered as an overlay error.

In some embodiments, in formation of the lower cavities 631, 651, 671, the first sections 281 of the patterned etch stop layer 28A may be patterned into first portions 283 so as to expose the connection portions 233 underneath, while the second sections 282 are patterned into second portions 284, so as to expose the second lines 234 underneath.

Step 105 including the sub-steps shown in FIGS. 18 to 23 may be known as a dual damascene process. In other embodiments, step 105 may also be performed using two single damascene processes, or any other suitable processes to achieve the structure shown in FIGS. 22 and 23.

Referring to FIG. 1 and the example illustrated in FIGS. 24 and 25, the method proceeds to step 106, where a second layer 61 is formed over the patterned dielectric layer 51, so as to permit the second layer 61 to be connected to the metal portion of the first interconnect level structure 60. FIG. 24 illustrates the cross-sectional view of the structure, at which the connection portions 233 are formed, subsequent to that shown in FIG. 22 in accordance with some embodiments. FIG. 25 illustrates the cross-sectional view of the structure, at which the connection portions 233 are absent, subsequent to that shown in FIG. 23 in accordance with some embodiments.

The second layer 61 includes a second electrically conductive material, which may be same as or different that of the first electrically conductive material, and thus details thereof may be omitted for the sake of brevity. The second layer 61 may be formed by performing one or more deposition processes, such as CVD, ALD, the likes, other suitable processes, or combinations thereof for depositing the second electrically conductive material, followed by one or more planarization processes (such as, CMP, and/or other suitable processes) may be used, but not limited thereto. Other materials and/or method for forming the second layer 61 are within the contemplated scope of the present disclosure.

The second layer 61 may serve as a metal portion of a second interconnect level structure 68, and includes first vias 63, a third line 62 connected to the first vias 63, a second via 65, a fourth line 64 connected to the second via 65, a third via 67, and a fifth line 66 connected to the third via 67. The patterned dielectric layer 51 serves as a dielectric portion of the second interconnect level structure 68.

Specifically, as exemplarily shown in FIGS. 24 and 25, the first vias 63 are respectively connected to the first lines 232 of the first interconnect level structure 60 through the connection portions 233, while the second and third vias 65, 67 are directly connected to the second lines 234, respectively. In some embodiments, the first via 63 and the second via 65 are simultaneously formed in the patterned dielectric layer 51.

Referring to FIG. 24, each of the first via 63, and a corresponding one of the connection portions 233 together serves as a via feature 70 that interconnects the first line 62 with the predetermined ones of the first lines 232. As shown in FIG. 24, two via features 70 are formed. The right via feature 70 shows that the right first via 63 and the right connection portion 233 that are aligned to each other in a manner that a bottom surface of the right first via 63 fully covers an upper surface of the right connection portion 233. A corresponding one of the first portions 283 is disposed around the right first via 63. It is noted that for the left via feature 70, a bottom surface of the left first via 63 is connected to a portion of the upper surface of the left connection portion 233 underneath, and a portion of an upper surface of a left adjacent one of the dielectric units 29, or, in other words, the upper surface of the left connection portion 233 is connected to both the left first via 63 and a corresponding one of the first portions 283 of the patterned etch stop layer 28A. That is, the left first via 63 is in slight misalignment with the left connection portion 233 underneath, and is shifted toward the left adjacent one of the dielectric units 29 (see the horizontal arrow shown in FIG. 24, indicating the shift of the left first via 63 from its original position). In such overlay condition, a minimal distance between the overlaid first via 63 and an adjacent one of the first lines 232 is indicated by the inclined arrow shown in FIG. 24. Since the first lines 232 are formed relatively lower, resulting in that the minimal distance is comparatively greater than the case that the first lines formed relatively higher (e.g., same as that of the second lines 234).

The first vias 63 formed on the connection portions 233 have a height (H4) which is same as that of the second vias 65, 67 formed on the second lines 234. The connection portions 233 (with the height (H3)) compensate the reduced height of the first lines 232 (with the first height (H1)) compared to the second lines 234 (with the second height (H2), which is equivalent to a sum of H1 and H3). As such, patterning loading in formation of the lower cavities 631 is relatively easy as the lower cavities 631 merely extends through the patterned lower dielectric 511 with the height (H4), so that the first vias 63 formed in the lower cavities 631 are respectively connected to the first lines 232 through the connection portions 233. In the case that the connection portions 233 are omitted, lower cavities (not shown) would have to be formed with a height equivalent to a sum of H4 and H3 so that first vias (not shown) can be connected to the first lines 232, which may be considered as a relatively heavy patterning loading.

In some embodiments, additional elements such as barrier layers (not shown) and/or etch stop layers (not shown) may be included in the second interconnect level structure 68 based on practical needs.

Figure 26:
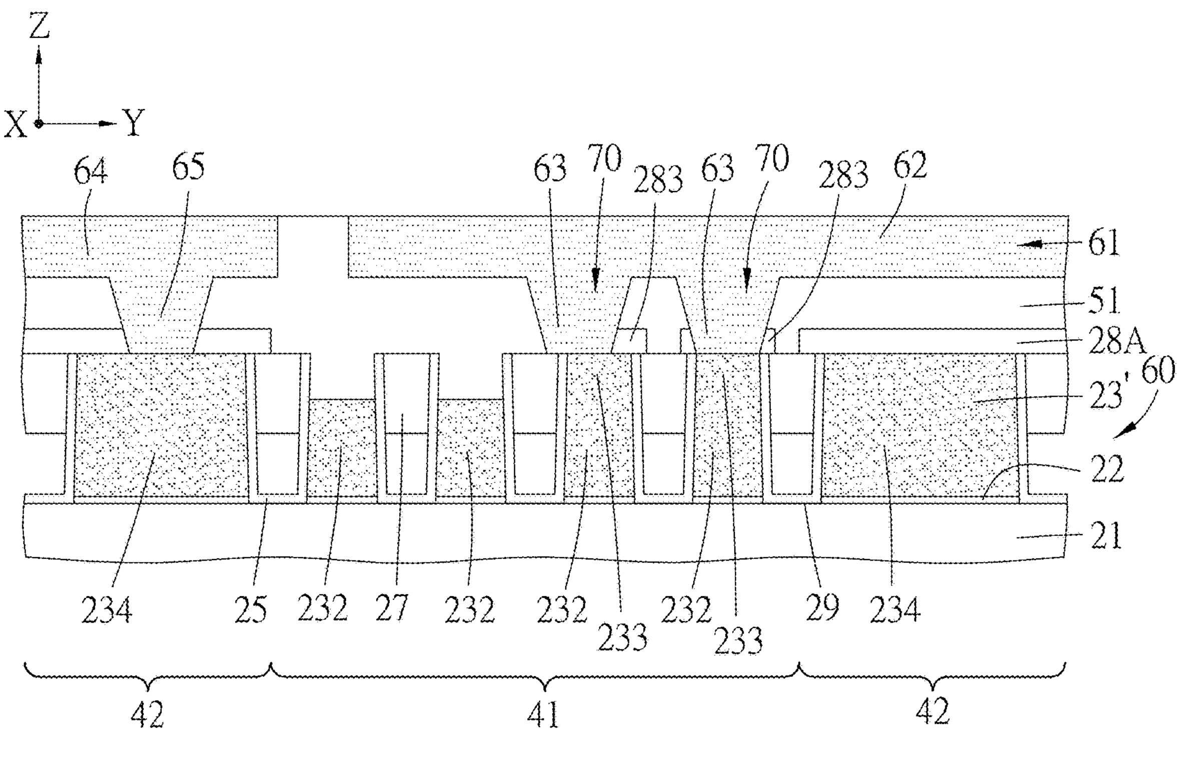

FIG. 26 is similar to FIG. 24, except that the dielectric units 29 are formed with different shapes. For the dielectric units 29 shown in FIG. 24, each of which is in a substantially rectangular shape, while for those shown in FIG. 26, each of which is in a substantially trapezium shape. Other suitable configurations for the dielectric units 29 are within the contemplated scope of the present disclosure.

Figure 27:
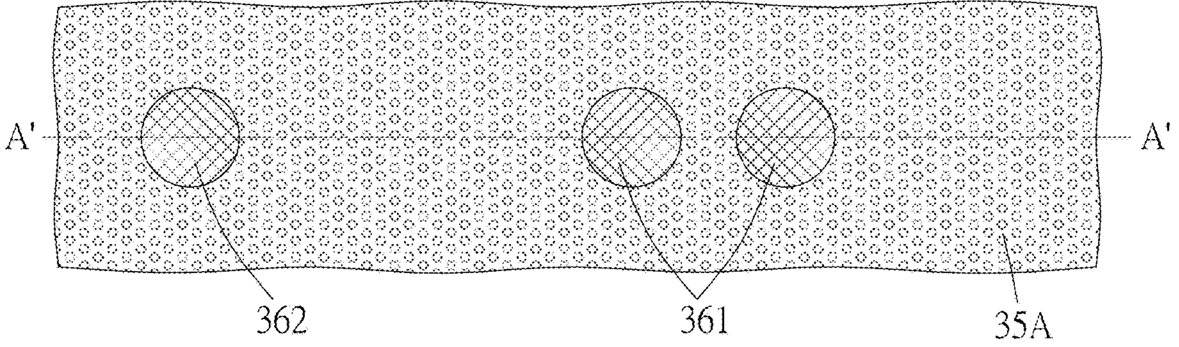
Figure 28:
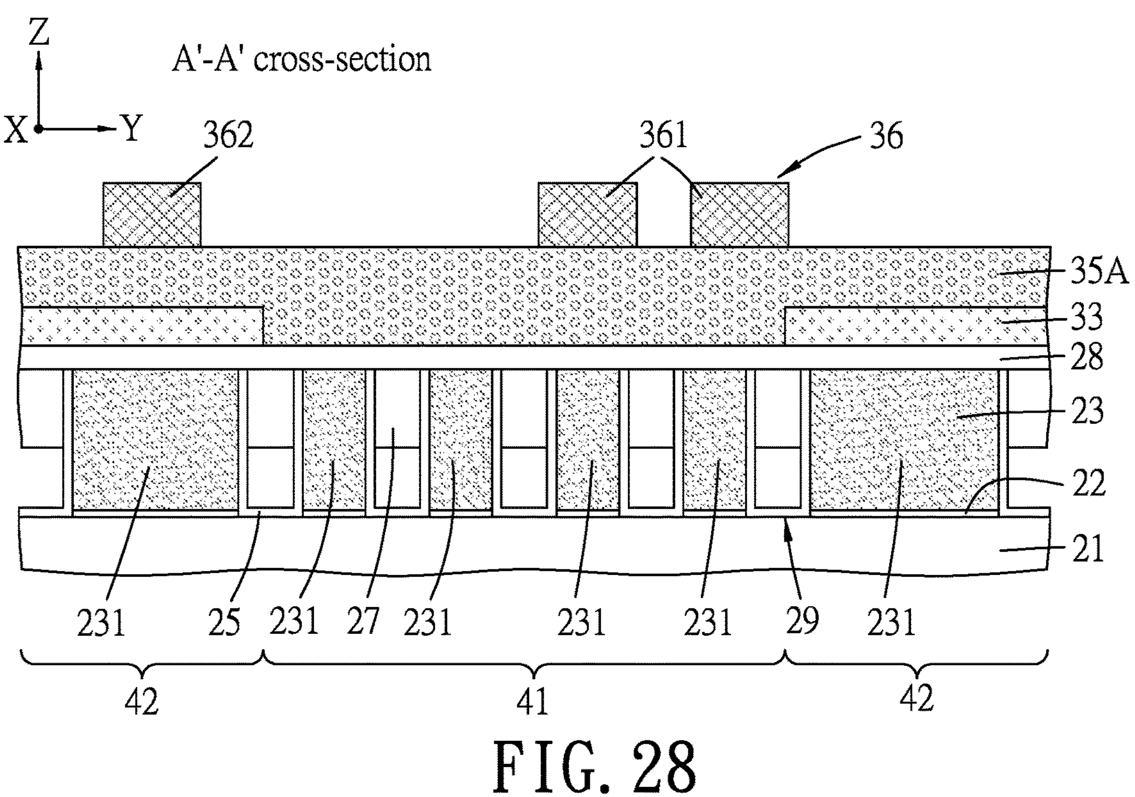

FIG. 28 is a cross-sectional view of the structure taken along a line A'-A' shown in FIG. FIG. 27, and FIGS. 29 to 33 illustrate cross-sectional views of the structure subsequent to that shown in FIG. 27. FIGS. 27 to 33 are respectively similar to FIGS. 11, 12, 14, 16, 18, 22 and 24, illustrating different stages of the method to acquire the semiconductor structure having an overlay condition of the right first via 63 (see FIG. 33) different from that shown in FIG. 24. Please note that only the cross-sectional views at which the connection portions 233 are formed is shown, and the cross-sectional views at which the connection portions 233 are absent, are not described (e.g., the fifth line 55 and the third via 67 shown in FIG. 25 are not described in the followings).

Figure 29:
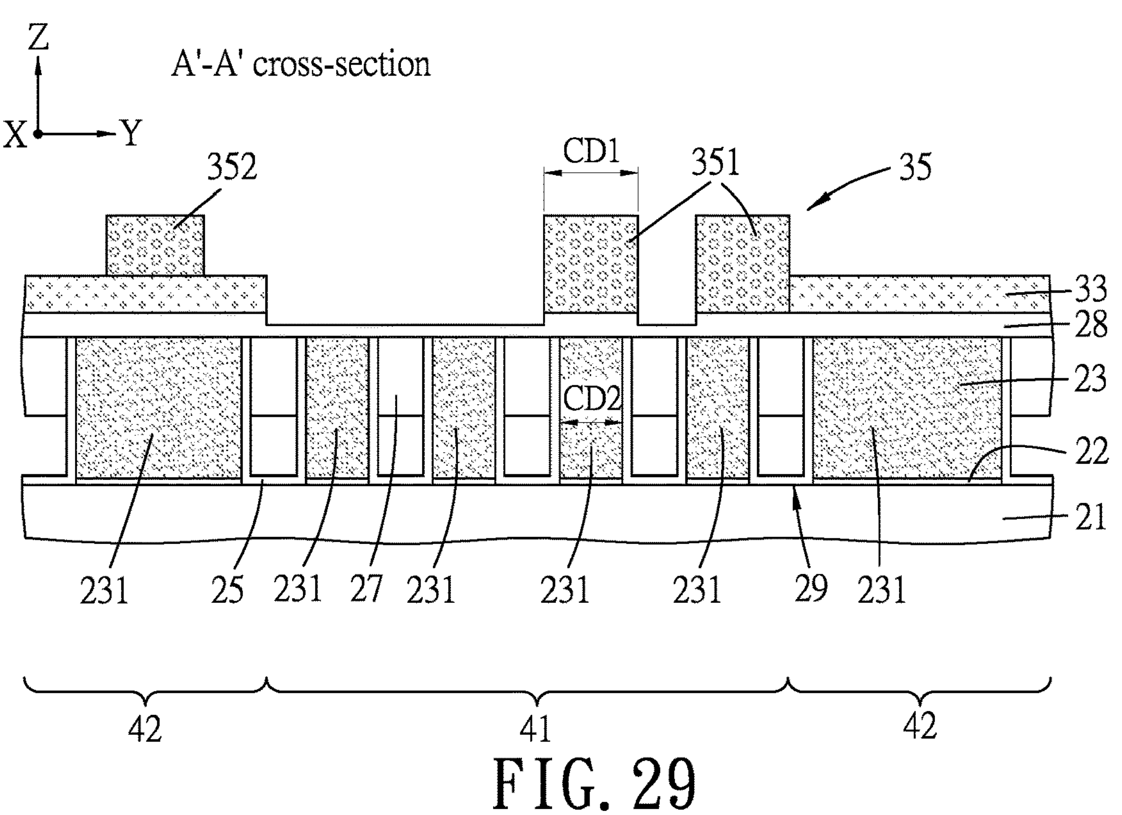
Figure 32:
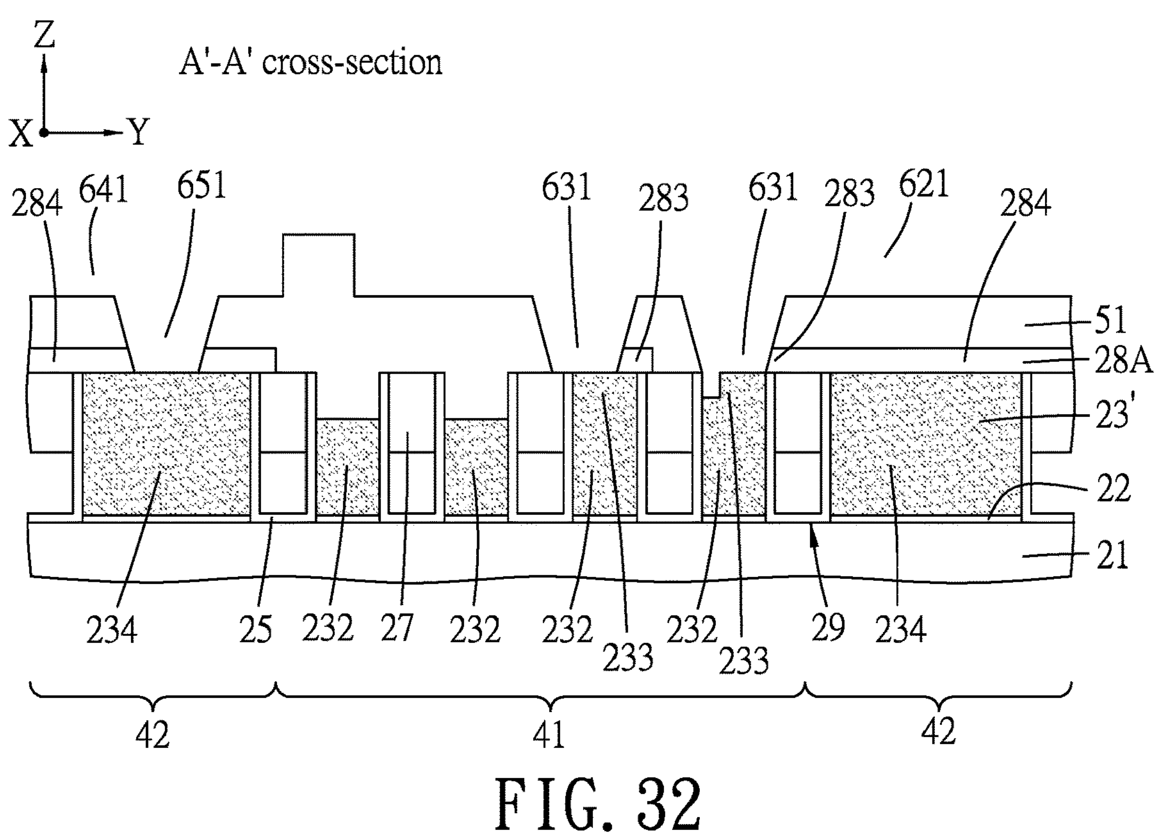
Figure 33:
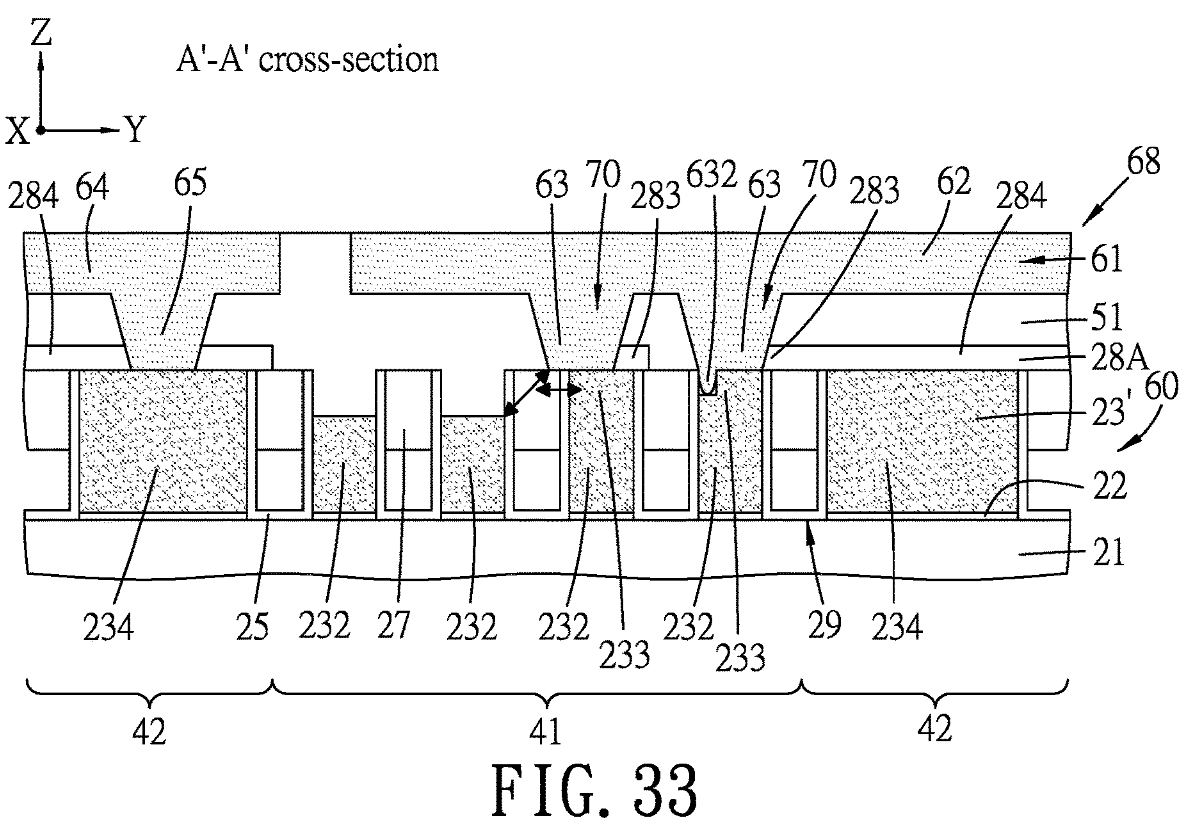

Referring to FIGS. 27 and 28, in this case, the right section 361 formed in step 103 is not completely in alignment with the corresponding predetermined one of the lines 231 underneath, but is shifted to the right, i.e., a projection of the right section 361 in the Z direction on the first interconnect level structure 60 may be shifted to cover a portion of the corresponding line 231 and a portion of a right adjacent ones of the dielectric units 29, compared to the structure shown in FIG. 12. As a result, the sections 361 shown in FIGS. 27 and 28 have a larger spaced-apart distance. Referring to FIG. 29, the right section 351 formed in step 103 through the patterned second photoresist 36 accordingly has an overlay condition similar to that of the right section 361 and is also shifted to the right. Referring to FIG. 30, in step 104, after patterning through the etch stop layer 28, the right predetermined one of the lines 231 is not entirely protected by the right section 351 due to the overlay, and has a small portion exposed from the patterned etch stop layer 28. As such, the exposed right predetermined one of the lines 231 is also subjected to the patterning process in step 104, resulting in a small recess formed in the right connection portion 233, as shown in FIG. 30. Referring to FIG. 31, in step 105, the lower dielectric 511A formed over the patterned etch stop layer 28A fills the small recess in the right connection portion 233. Referring to FIG. 32, in forming the lower cavity 631 on the right in the patterned dielectric layer 51 in step 105, the dielectric material filling the small recess in the right connection portion 233 is also removed, leaving the recess empty. Referring to FIG. 33, in step 106 for forming the second layer 61, the second electrically conductive material is filled into the lower cavities 631 (see FIG. 32) and the recess in the right connection portion 233, thereby forming the first vias 63. The resultant right first via 63 has a tiger tooth portion 632-*a* portion extending downwardly to be connected to a side surface of the right connection portion 233.

In some embodiments, a photomask used in formation of the patterned second photoresist 36 (see FIG. 28) may also be used in formation of the lower cavities 631, 651 (see FIG. 32). In such case, a patterned photoresist (not shown), which is formed on and exposes portions of the lower dielectric 511A (see also FIG. 20) and which is used for forming the lower cavities 631, 651, is made of a photoresist material that is opposite in type to the photoresist material for forming the patterned second photoresist 36. That is, if the not-shown patterned photoresist is a positive photoresist, the patterned second photoresist 36 is a negative photoresist, and vice versa. As such, referring to FIGS. 27 and 28, the patterned second photoresist 36 further includes a dummy section 362 located at the second region 42, and referring to FIG. 29, the patterned second mask 35, which is formed through the patterned second photoresist 36, similarly also includes a dummy section 352 located at the second region 42. Such dummy sections 352, 362 correspond in position to the second via 65 (see FIG. 33) and do not serve any specific function in terms of patterning the first layer 23 and will be removed together with the sections 351, 361, respectively.

Figure 34:
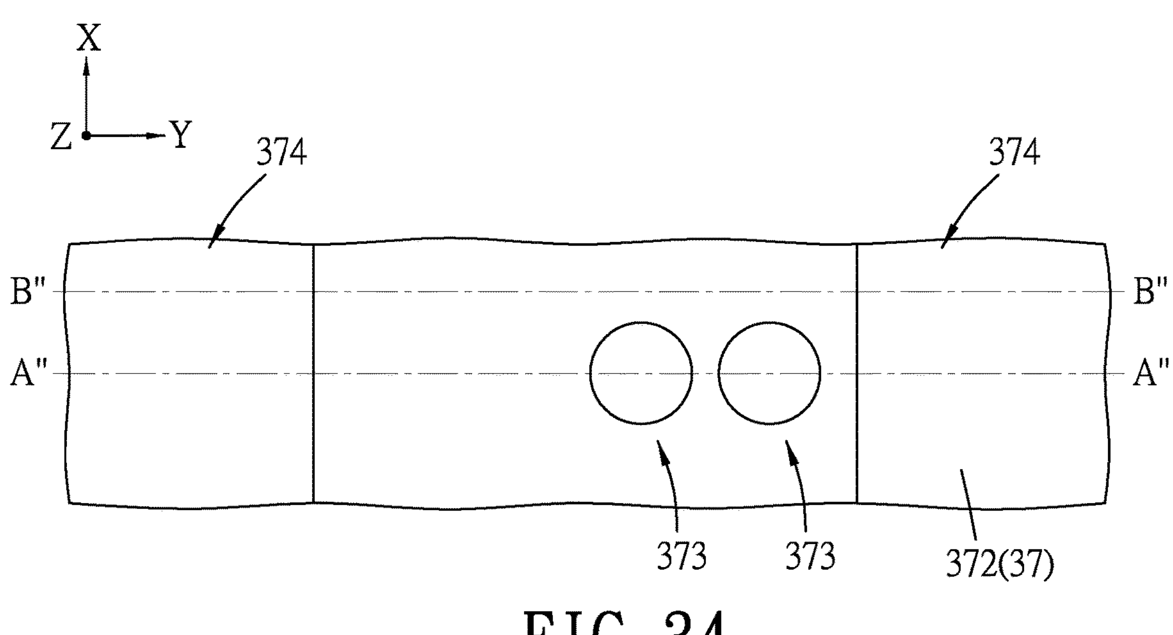
Figure 35:
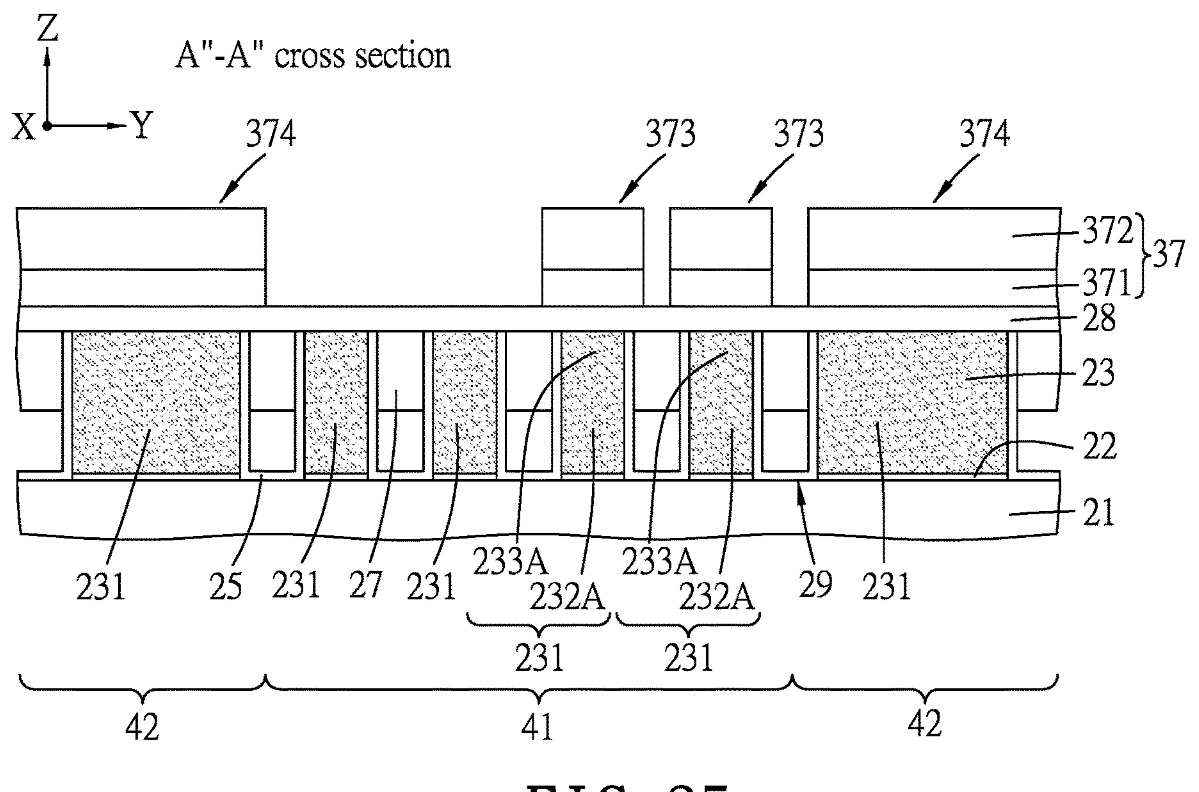
Figure 36:
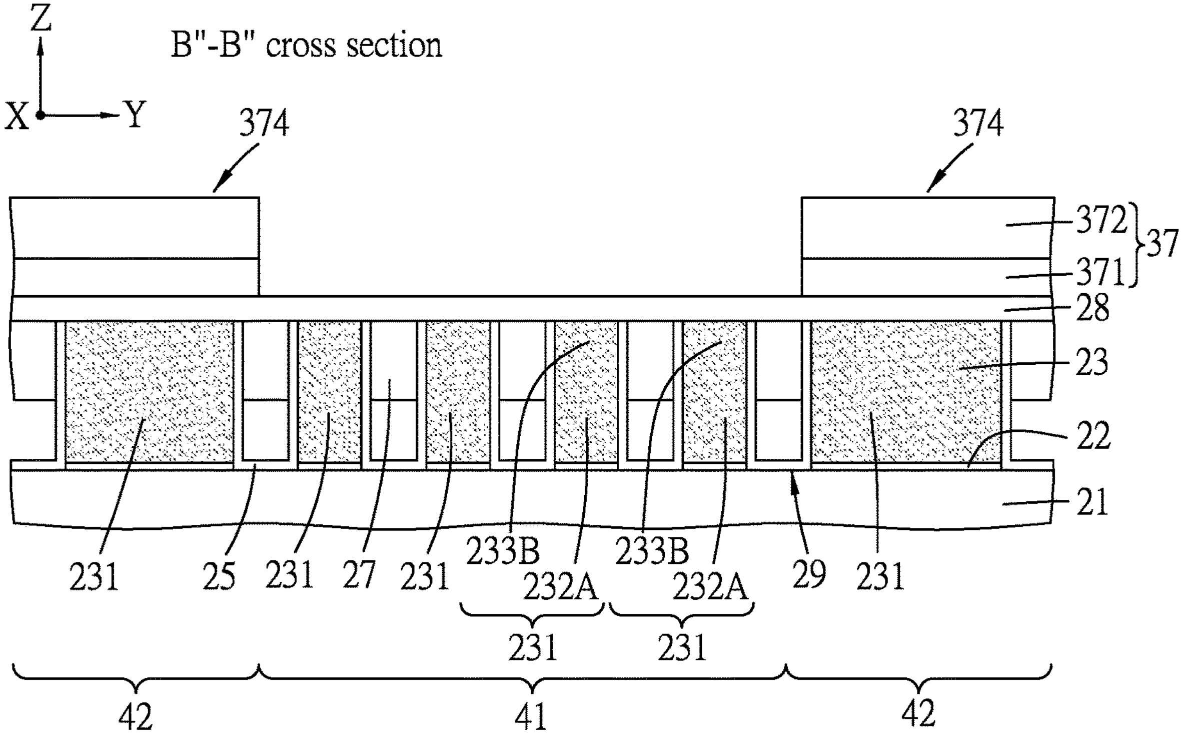

FIGS. 34 to 36 illustrate a possible modification to the abovementioned method regarding formation of the patterned first and second masks 33, 35 in steps 102 and 103 described with reference to FIGS. 9 to 14. From the example illustrated in FIGS. 9 to 14, the patterned first mask 33 is formed to define the first region 41 (including the lines 231 that are exposed and recessed to form the first lines 232 in subsequent step) and the second region 42 (including lines 231 that are covered and not-recessed to serve as the second lines 234), and the patterned second mask 35 is formed to define and cover the first parts 233A of the predetermined ones of the lines 231 at the first region 41, so as to form the connection portions 233 on the predetermined ones of the first lines 232. That is, two different masks are formed separately to facilitate patterning of the first layer 23. In the example illustrated in FIGS. 34 to 36, one single mask, namely a patterned mask unit 37, is formed over the etch stop layer 28 prior to patterning the first layer 23. FIG. 34 illustrates a top view of the patterned mask unit 37 (the etch stop layer 28, and elements underneath are not shown in this figure). FIG. 35 is a cross-sectional view of the structure taken along line A"-A" of FIG. 34, at which the first parts 233A are present, in accordance with some embodiments. FIG. 36 illustrates another cross-sectional view of the structure taken along line B"-B" of FIG. 34, at which the second parts 233B are present, in accordance with some embodiments. The patterned mask unit 37 includes first sections 373 covering the first parts 233A of the predetermined ones of the lines 231 at the first region 41, and second sections 374 covering the second region 42. That is, the first sections 373 of the patterned mask unit 37 are similar to the second patterned mask 35 illustrated in FIG. 14, while the second sections 374 of the patterned mask unit 37 are similar to the patterned first mask 33 illustrated in FIGS. 9 to 15. The second parts 233B of the predetermined one of the lines 231 are exposed from the patterned mask unit 37, so as to be removed in patterning of the first layer 231 performed in step 104.

Each of the first and second sections 373, 374 of the patterned mask unit 37 may include a hard mask layer 371 formed on the etch stop layer 28, and a photoresist 372 formed on the hard mask layer 371 opposite to the etch stop layer 28. Possible materials and processes for forming the hard mask layer 371 may be similar to those for forming the patterned first mask 33 described in FIG. 9, and possible materials and processes for forming the photoresist 372 may be similar to those for forming the patterned first photoresist 34 described in FIG. 9, and thus details thereof are omitted for the sake of brevity. By forming the patterned mask unit 37, the structure shown in FIGS. 34 to 36 may be ready to proceed to step 104 for patterning the first layer 23.

The embodiments of the present disclosure have the following advantageous features. The first and second lines at the first interconnect level structure 60 are formed with different height, so that the first interconnect level structure 60 achieves different capacitance and resistance. To compensate the reduced height of the first lines 232 compared to that of the second lines 234, the connection portions 233 are formed on the predetermined ones of the first lines 232, so that in formation of the lower cavities 631 for accommodating the first vias 63 that interconnect the metal portions of the first and second interconnect level structures 60, 68, the lower cavities 631 can be formed with less patterning loading. In addition, such connection portions 233 are formed in a self-aligned manner on account of the connection portions 233 are formed between the dielectric units 29 and the connection portions 233 are integrally formed with the first lines 232. In the event of slight misalignment between one of the first vias 63 and a corresponding one of the connection portions 233, a distance between such first via 63 and an adjacent one of the comparatively lower first lines 232 is greater compared with when the adjacent one of the first lines (not shown) is comparatively higher (i.e., not reduced in height), which results in the first interconnect level structure 60 having a larger TDDB window. Furthermore, a majority of the first region 41 is exposed from the patterned etch stop layer 28A, which is conducive for further reducing the capacitance of the first interconnect level structure 60.

In accordance with some embodiments of the present disclosure, a method for manufacturing a semiconductor structure includes: forming a first layer on a base structure, the first layer being made of a first electrically conductive material, and having a first region and a second region displaced from the first region, each of the first region and the second region including a conductive line; patterning the first layer such that the conductive line at the first region is selectively recessed to have a recessed portion which has a first height and a non-recessed portion which has a second height that is greater than the first height and that is the same as a height of the conductive line at the second region; forming a patterned dielectric layer over the patterned first layer such that the non-recessed portion is exposed from the patterned dielectric layer; and forming a second layer over the patterned dielectric layer so as to permit the second layer to be connected to the non-recessed portion, the second layer being made of a second electrically conductive material.

In accordance with some embodiments of the present disclosure, patterning the first layer includes: forming a patterned masking unit to cover the conductive line at the second region and the non-recessed portion of the conductive line at the first region; and patterning the first layer through the patterned masking unit such that a portion of the conductive line at the first region, which is exposed from the patterned masking unit, is recessed to form the recessed portion.

In accordance with some embodiments of the present disclosure, the patterned masking unit includes a section covering the non-recessed portion, a width of the section being greater than a width of the non-recessed portion.

In accordance with some embodiments of the present disclosure, forming the patterned masking unit includes: forming a patterned first mask over the first layer to expose the first region; and forming a patterned second mask to cover the non-recessed portion of the conductive line at the first region, the patterned second mask being made of a material different from that of the patterned first mask.

In accordance with some embodiments of the present disclosure, forming the patterned second mask includes: forming a second mask layer over the patterned first mask and the first layer; forming a protection mask layer over the second mask layer, the protection mask layer being made of a material different from that of the second mask layer; patterning the protection mask layer to form a cover mask that corresponds in position to the non-recessed portion of the conductive line at the first region; and patterning the second mask layer (through the cover mask, such that the patterned second mask covers the non-recessed portion of the conductive line at the first region.

In accordance with some embodiments of the present disclosure, the patterned second mask includes a section covering the non-recessed portion, a width of the section being greater than a width of the non-recessed portion.

In accordance with some embodiments of the present disclosure, the method further includes forming an etch stop layer over the first layer, prior to patterning the first layer, the etch stop layer being patterned to expose a portion of the conductive line at the first region, in patterning the first layer, the portion of the conductive line at the first region is recessed to form the recessed portion, and in forming the patterned dielectric layer, the patterned dielectric layer being formed over the patterned etch stop layer and the patterned first layer.

In accordance with some embodiments of the present disclosure, a method for manufacturing a semiconductor structure includes: forming a patterned first layer which is made of a first electrically conductive material, and which includes first lines, second lines, and a connection portion disposed on a part of one of the first lines, the first lines having a height lower than a height of the second lines; forming a first via which is connected to an upper surface of the connection portion, the first via having a height above the connection portion; and forming a second via which is connected to an upper surface of one of the second lines, the second via having a height that is the same as the height of the first via above the connection portion.

In accordance with some embodiments of the present disclosure, the method further includes, prior to forming the first via and the second via, forming a patterned dielectric layer over the patterned first layer.

In accordance with some embodiments of the present disclosure, the first via and the second via are simultaneously formed in the patterned dielectric layer, and are made of a second electrically conductive material.

In accordance with some embodiments of the present disclosure, the first via has a portion extending downwardly to be connected to a side surface of the connection portion.

In accordance with some embodiments of the present disclosure, the method further includes forming a patterned etch stop layer on the patterned first layer, the patterned etch stop layer having a first portion which is formed around the first via, and a second portion which is disposed on the second lines.

In accordance with some embodiments of the present disclosure, the upper surface of the connection portion is connected to both the first via and the first portion of the patterned etch stop layer.

In accordance with some embodiments of the present disclosure, the method further includes forming a plurality of dielectric units such that two adjacent ones of the first lines and the second lines are spaced apart from each other by a corresponding one of the dielectric units.

In accordance with some embodiments of the present disclosure, each of the dielectric units has an upper surface at a level which is the same as that of an upper surface of each of the second lines.

In accordance with some embodiments of the present disclosure, the method further includes, prior to forming the patterned dielectric layer, forming a patterned etch stop layer on the patterned first layer, the patterned etch stop layer having a first portion which is formed around the first via, and a second portion which is disposed on the second lines, such that after forming the patterned dielectric layer, the first lines are in direct contact with the patterned dielectric layer.

In accordance with some embodiments of the present disclosure, each of the dielectric units includes an air gap therein.

In accordance with some embodiments of the present disclosure, a semiconductor structure includes: a base structure; a first interconnect level structure; and a second interconnect level structure. The first interconnect level structure is formed over the base structure, and includes a first region and a second region. The first region includes a plurality of first lines, and a connection portion formed on a part of one of the first lines. The first lines are each elongated in an X direction, and spaced apart from each other in a Y direction transverse to the X direction. The first lines have a first height. The second region includes a plurality of second lines that have a second height which is greater than the first height. An upper surface of each of the second lines is at a level same as an upper surface of the connection portion. The second lines are elongated in the X direction, and spaced apart from each other in the Y direction. The second interconnect level structure is formed on the first interconnect level structure, and includes a third line elongated in the Y direction, and a first via connected to an upper surface of the connection portion so as to permit the one of the first lines to be connected to the third line through the first via and the connection portion.

In accordance with some embodiments of the present disclosure, the second interconnect level structure further includes a patterned dielectric layer formed between the first interconnect level structure and the third line of the second interconnect level structure. The first via is formed to extend through the patterned dielectric layer so as to connect the third line to the connection portion.

In accordance with some embodiments of the present disclosure, the semiconductor structure further includes a patterned etch stop layer disposed between the first interconnect level structure and the patterned dielectric layer. The patterned etch stop layer includes a first portion which is formed around the first via, and a second portion disposed on the second lines.

The foregoing outlines features of several embodiments so that those skilled in the art may better understand the aspects of the present disclosure. Those skilled in the art should appreciate that they may readily use the present disclosure as a basis for designing or modifying other processes or structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for manufacturing a semiconductor structure, comprising:

forming a first layer on a base structure, the first layer being made of a first electrically conductive material, and having a first region and a second region displaced from the first region, each of the first region and the second region including a conductive line;

patterning the first layer such that the conductive line at the first region is selectively recessed to have a recessed portion which has a first height and a non-recessed portion which has a second height that is greater than the first height and that is the same as a height of the conductive line at the second region;

forming a patterned dielectric layer over the patterned first layer such that the non-recessed portion is exposed from the patterned dielectric layer; and forming a second layer over the patterned dielectric layer so as to permit the second layer to be connected to the non-recessed portion, the second layer being made of a second electrically conductive material, wherein patterning the first layer includes:

forming a patterned masking unit which includes forming a patterned first mask to cover the conductive line at the second region and to expose the first region, and forming a patterned second mask to cover the non-recessed portion of the conductive line at the first region, the patterned second mask being made of a material different from a material of the patterned first mask; and patterning the first layer through the patterned masking unit such that a portion of the conductive line at the first region, which is uncovered by the patterned masking unit, is recessed to form the recessed portion.

2. The method according to claim 1, wherein forming the patterned second mask includes:

forming a second mask layer over the patterned first mask and the first layer;

forming a protection mask layer over the second mask layer, the protection mask layer being made of a material different from a material of the second mask layer;

patterning the protection mask layer to form a cover mask that corresponds in position to the non-recessed portion of the conductive line at the first region; and patterning the second mask layer through the cover mask, such that the patterned second mask covers the non-recessed portion of the conductive line at the first region.

3. The method according to claim 1, wherein the patterned second mask includes a section covering the non-recessed portion, a width of the section being greater than a width of the non-recessed portion.

4. The method according to claim 1, further comprising, forming an etch stop layer over the first layer, prior to patterning the first layer, the etch stop layer being patterned to expose a portion of the conductive line at the first region, in patterning the first layer, the portion of the conductive line at the first region being recessed to form the recessed portion, and in forming the patterned dielectric layer, the patterned dielectric layer being formed over the patterned etch stop layer and the patterned first layer.

5. A method for manufacturing a semiconductor structure, comprising:

forming a patterned first layer which is made of a first electrically conductive material, and which includes first lines, second lines, and a connection portion disposed on a part of one of the first lines, the first lines having a height lower than a height of the second lines;

forming a first via which is connected to an upper surface of the connection portion, the first via having a height above the connection portion;

forming a second via which is connected to an upper surface of one of the second lines, the second via having a height that is the same as the height of the first via above the connection portion; and forming a patterned etch stop layer on the patterned first layer, the patterned etch stop layer having a first portion which is formed around the first via, and a second portion which is disposed on the second lines, wherein the upper surface of the connection portion is connected to both the first via and the first portion of the patterned etch stop layer.

6. The method according to claim 5, further comprising prior to forming the first via and the second via, forming a patterned dielectric layer over the patterned first layer.

7. The method according to claim 6, wherein the first via and the second via are simultaneously formed in the patterned dielectric layer, and are made of a second electrically conductive material.

8. The method according to claim 6, further comprising, forming a plurality of dielectric units such that two adjacent ones of the first lines and the second lines are spaced apart from each other by a corresponding one of the dielectric units.

9. The method according to claim 8, wherein each of the dielectric units has an upper surface at a level which is the same as a level of an upper surface of each of the second lines.

10. The method according to claim 8, wherein prior to forming the patterned dielectric layer, the patterned etch stop layer is formed, and wherein after forming the patterned dielectric layer, the first lines are connected to the patterned dielectric layer.

11. The method according to claim 8, wherein each of the dielectric units includes an air gap therein.

12. A method for manufacturing a semiconductor structure, comprising:

forming a first layer on a base structure, the first layer being made of a first electrically conductive material, and having a first region and a second region displaced from the first region, the first region including first conductive lines that extend lengthwise in a first direction, and that are spaced apart from each other in a second direction different from the first direction, the first conductive lines each having a bottom segment and an upper segment connected to each other along a third direction different from the first direction and the second direction, the second region including second conductive lines that extend lengthwise in the first direction, and that are spaced apart from each other in the second direction, and forming a patterned first mask over the second conductive lines, the first region being uncovered by the patterned first mask;

forming a patterned second mask that covers a first part of the upper segment of a first predetermined one of the first conductive lines; and performing a patterning process to pattern the first layer through the patterned first mask and the patterned second mask, such that a second part of the upper segment of the first predetermined one of the first conductive lines and the upper segment of a second predetermined one of the first conductive lines are removed, and such that the first part of the upper segment of the first predetermined one of the first conductive lines remains unpatterned, and such that the second conductive lines remain unpatterned.

13. The method according to claim 12, further comprising forming a second layer that is made of a second electrically conductive material, the second layer being connected to the first part of the upper segment of the first predetermined one of the first conductive lines.

14. The method according to claim 12, wherein the patterned second mask is formed after forming the patterned first mask.

15. The method according to claim 12, wherein:

before the patterning process, a height of the first conductive lines at the first region is same as a height of the second conductive lines at the second region measured in the third direction; and after the patterning process, a height of the second predetermined one of the first conductive lines is smaller than a height of the second conductive lines measured in the third direction.

16. The method according to claim 12, wherein the patterned second mask and the patterned first mask are formed at the same time.

17. The method according to claim 12, wherein forming the patterned first mask includes:

sequentially depositing a mask layer and a photoresist layer over the first layer;

forming the photoresist layer into a patterned photoresist; and patterning the mask layer through the patterned photoresist into the patterned first mask.

18. The method according to claim 12, further comprising forming a first via which is connected to an upper surface and a side surface of the first part of the upper segment of the first predetermined one of the first conductive lines.

19. The method according to claim 5, wherein a height of the connection portion is greater than 30 Å.

20. The method according to claim 5, wherein the connection portion and the part of the one of the first lines are integrally formed.

* * * * *